United States Patent
Itoh et al.

(10) Patent No.: US 9,064,908 B2
(45) Date of Patent: Jun. 23, 2015

(54) SUBSTRATE LIQUID PROCESSING APPARATUS, LIQUID PROCESSING METHOD, AND STORAGE MEDIUM

(75) Inventors: Norihiro Itoh, Koshi (JP); Kazuhiro Aiura, Koshi (JP)

(73) Assignee: Tokyo Electron Limited, Minato-Ku (JP)

(*) Notice: Subject to any disclaimer, the term of this patent is extended or adjusted under 35 U.S.C. 154(b) by 400 days.

(21) Appl. No.: 13/490,799

(22) Filed: Jun. 7, 2012

(65) Prior Publication Data

US 2012/0312336 A1    Dec. 13, 2012

(30) Foreign Application Priority Data

Jun. 9, 2011   (JP) ................. 2011-129241

(51) Int. Cl.
*H01L 21/67*    (2006.01)
*H01L 21/677*   (2006.01)

(52) U.S. Cl.
CPC ...... *H01L 21/67051* (2013.01); *H01L 21/6708* (2013.01); *H01L 21/67748* (2013.01)

(58) Field of Classification Search
CPC ................. H01L 21/6708; H01L 21/67051
See application file for complete search history.

(56) References Cited

U.S. PATENT DOCUMENTS

| | | | |
|---|---|---|---|
| 2006/0216948 A1* | 9/2006 | Ohmi et al. | 438/765 |
| 2007/0204885 A1* | 9/2007 | Toshima et al. | 134/95.1 |
| 2008/0092929 A1* | 4/2008 | Yokouchi | 134/30 |
| 2008/0178917 A1* | 7/2008 | Miyagi et al. | 134/57 R |
| 2011/0240601 A1* | 10/2011 | Hashizume et al. | 216/83 |

FOREIGN PATENT DOCUMENTS

| | | |
|---|---|---|
| JP | 11-033467 A1 | 2/1999 |
| JP | 2002-136935 A1 | 5/2002 |
| JP | 2005-142290 A1 | 6/2005 |
| JP | 2007-035866 A1 | 2/2007 |

OTHER PUBLICATIONS

Japanese Office Action (Application No. 2011-129241) dated May 16, 2014.

* cited by examiner

*Primary Examiner* — Michael Barr
*Assistant Examiner* — Spencer Bell
(74) *Attorney, Agent, or Firm* — Burr & Brown, PLLC

(57) ABSTRACT

There is provided a liquid processing apparatus capable of efficiently processing a pattern formation surface of a wafer, while preventing diffusion of a chemical-liquid atmosphere which might possibly occurs during a chemical-liquid process.

20 Claims, 16 Drawing Sheets

SUBSTRATE LIQUID PROCESSING APPARATUS, LIQUID PROCESSING METHOD, AND STORAGE MEDIUM

CROSS-REFERENCE TO RELATED APPLICATION

This application is based on and claims the benefit of priorities from Japanese Patent Application No. 2011-129241 filed on Jun. 9, 2011, the entire contents of which are incorporated herein by reference.

FIELD OF THE INVENTION

The present invention relates to a liquid processing apparatus and a liquid processing method, for subjecting a substrate to a predetermined liquid process, such as a cleaning process or an etching process, by supplying a process liquid to the substrate while heating and rotating the substrate.

BACKGROUND OF THE INVENTION

In a manufacturing process of semiconductor devices, a resist film is formed with a predetermined pattern on a film to be processed that has been formed on a substrate such as a semiconductor wafer (hereinafter referred to simply as "wafer"), and the film to be processed is subjected to processes such as an etching and an ion injection, by using the resist film as a mask. After the process, the resist film that is no more needed is removed from the wafer.

Recently, an SPM process is often used as a method of removing the resist film. The SPM process is performed by heating an SPM (Sulfuric Acid Hydrogen Peroxide Mixture) liquid, which has been obtained by mixing sulfuric acid solution and hydrogen peroxide solution, and supplying the heated SPM liquid to the resist film.

In the SPM process, the SPM liquid heated to a high temperature is generally discharged toward the wafer. Thus, the SPM liquid evaporates so that a fume is generated. The fume may diffuse over a wide range in a chamber of a resist removing apparatus, which contaminates or corrodes an inner wall of the chamber and components in the chamber, resulting in generation of a substance causing wafer contamination.

In order to prevent that the fume diffuses over a wide range in the chamber so that the inner wall of the chamber and the components in the chamber are contaminated or corroded, JP2007-35866A proposes a resist removing apparatus including: a substrate retaining unit configured to retain a wafer; a shielding wall surrounding a circumference of the wafer held by the substrate retaining unit and having an opening above the wafer; a cover member disposed above the shielding wall; and a nozzle inserted from a lateral side through a gap between the shielding wall and the cover member, the nozzle being configured to discharge the SPM liquid toward the wafer. According to the resist removing apparatus described in JP2007-35866A, diffusion of the fume over a wide range in the chamber is prevented by the shielding wall and the cover member.

SUMMARY OF THE INVENTION

In the resist removing apparatus described in JP2007-35866A, there is a possibility that the cover member is contaminated by the fume and/or the SPM liquid. For example, it can be considered that the fume suppressed by the cover member condenses on the cover member so that liquid drops adhere to the cover member, and/or that the SPM liquid discharged toward the wafer scatters so that droplets of the SPM liquid adhere to the cover member. In this case, it can be considered that, in a process succeeding to the SPM process, the liquid drops and/or droplets fall down on the wafer, so that the wafer is contaminated. When the liquid drops having adhered to the cover member dry, pieces of the dried portion become particles that may float above the wafer and then adhere to the wafer, so that the wafer is contaminated.

The present invention provides a liquid processing apparatus and a liquid processing method capable of efficiently solving the above problem.

According to a first aspect of the present invention, a liquid processing apparatus comprises a substrate retaining unit configured to horizontally retain a substrate; a process-fluid nozzle disposed above an upper surface of the substrate, the process-fluid nozzle having a discharge opening through which a chemical liquid is discharged onto the upper surface of the substrate; a process-fluid supply mechanism configured to supply the chemical liquid to the process-fluid nozzle; a cover mechanism capable of covering the substrate from above, when the chemical liquid is discharged onto the upper surface of the substrate by the process-fluid nozzle; a vertical driving mechanism configured to vertically drive the cover mechanism between a lowered position at which the cover mechanism covers the substrate from above, when the chemical liquid is discharged onto the upper surface of the substrate by the process-fluid nozzle, and a raised position that is higher than the lowered position; a chamber in which the substrate retaining unit, the process-fluid nozzle and the cover mechanism are located; an air hood configured to be situated between the substrate and the cover mechanism, when the cover mechanism is situated on the raised position, and configured to form a downflow of a clean gas; and a horizontal driving mechanism configured to horizontally drive the air hood between an advanced position at which the air hood vertically shields the substrate from the cover mechanism, and a retracted position.

In addition, according to a second aspect of the present invention, a liquid processing method comprises retaining a substrate in a horizontal posture, with a pattern formation surface facing upward; covering the substrate from above by a cover mechanism which is situated on lowered position; supplying a chemical liquid onto the upper surface of the substrate; moving the cover mechanism to a raised position that is higher than the lowered position; locating an air hood between the cover mechanism, which has been moved upward, and the substrate; and forming a downflow of a clean gas by the air hood. In addition, according to a third aspect of the present invention, a non-transitory computer-readable storage medium storing a computer executable program that, when executed, causes a computer to execute the above liquid processing method is provided.

According to the present invention, since an air hood is located such that, when a cover mechanism is situated on a raised position, a substrate is vertically shielded from the cover mechanism, a liquid adhering to the cover mechanism can be prevented from falling down on the substrate. In addition, since the air hood forms a downflow of a clean gas, the substrate can be prevented from being contaminated by particles.

DETAILED DESCRIPTION OF THE INVENTION

Processing System

Figure 1:
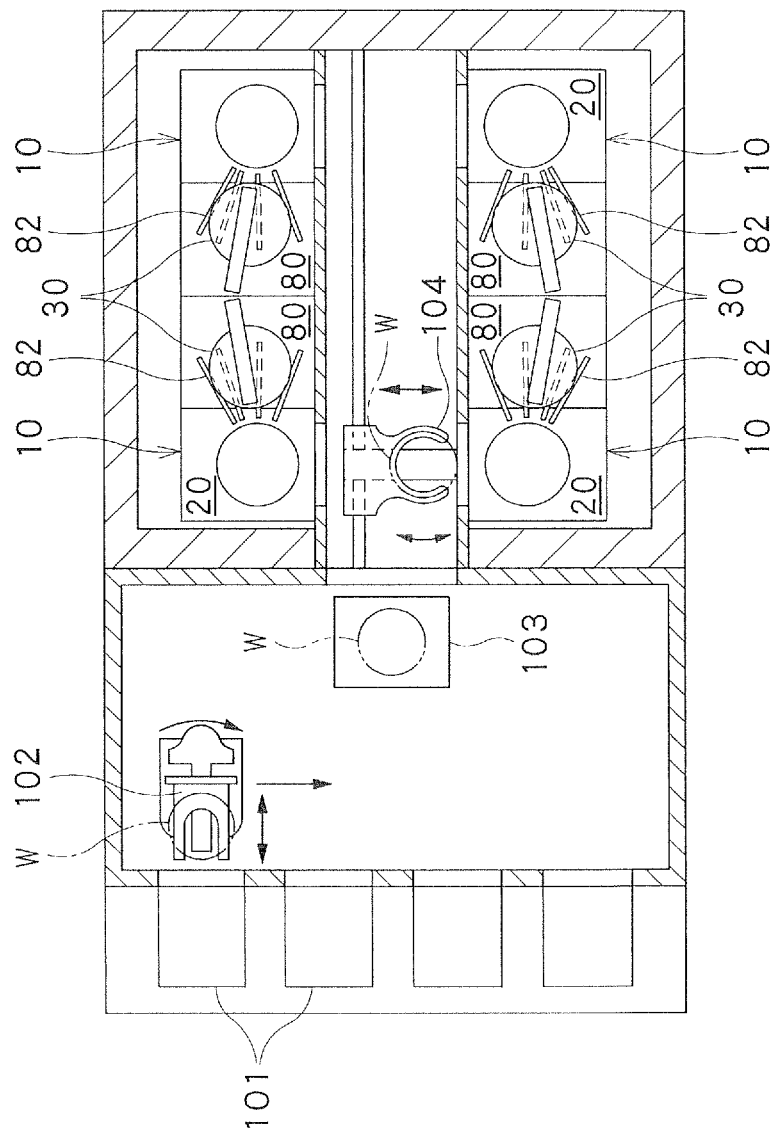
FIG. 1 is an upper plan view of a liquid processing system including a liquid processing apparatus according to an embodiment of the present invention, which is seen from above.

An embodiment of the present invention will be described herebelow with reference to the drawings. First, a processing system including a liquid processing apparatus according to the embodiment of the present invention is described with reference to FIG. 1. As shown in FIG. 1, the processing system includes: a table 101 on which a carrier accommodating a semiconductor wafer W (hereinafter referred to simply as "wafer W") as a substrate to be processed, which has been transported thereto from outside, is placed; a transport arm 102 configured to take out the wafer W accommodated in the carrier; a shelf unit 103 on which the wafer W, which has been taken out by the transport arm 102, is placed; and a transport arm 104 configured to receive the wafer W placed on the shelf unit 103 and to transport the wafer W into a liquid processing apparatus 10. As shown in FIG. 1, the liquid processing system includes the plurality of (four in the embodiment shown in FIG. 1) liquid processing apparatuses 10.

Liquid Processing Apparatus

Figure 2:
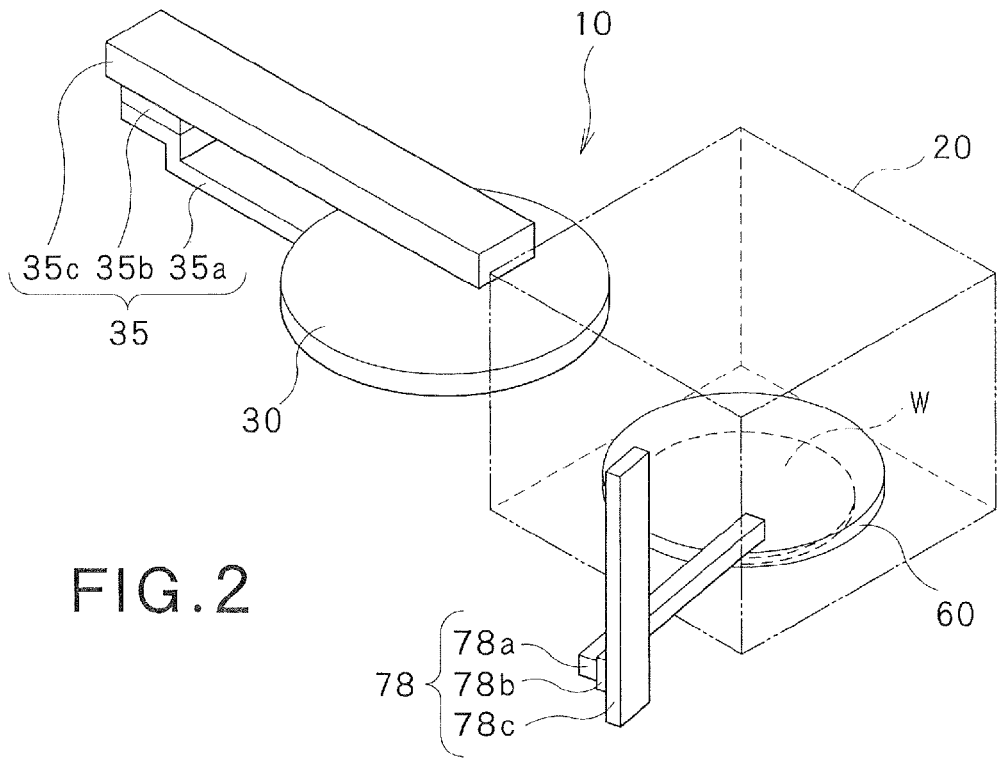
FIG. 2 is a perspective view showing the liquid processing apparatus according to the embodiment of the present invention, in which a cover mechanism is situated on a lowered position and a shielding mechanism is situated on a retracted position.
Figure 3:
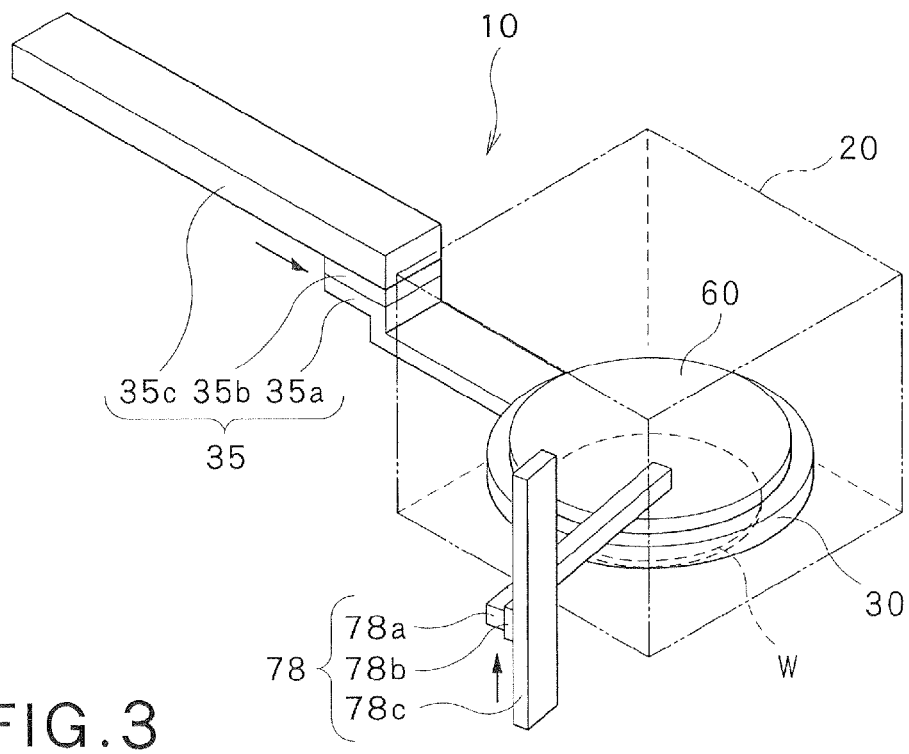
FIG. 3 is a perspective view showing the liquid processing apparatus according to the embodiment of the present invention, in which the cover mechanism is situated on a raised position and the shielding mechanism is situated on an advanced position.

Next, a schematic structure of the liquid processing apparatus 10 is described with reference to FIGS. 1 to 3. As shown in FIG. 1, the liquid processing apparatus 10 according to this embodiment includes a chamber 20 in which a wafer W is accommodated and the accommodated wafer W is subjected to a liquid process, and a waiting room 80 formed adjacently to the chamber 20. As shown in FIGS. 2 and 3, disposed in the chamber 20 are a wafer W and a cover mechanism 60 located above the wafer W. The cover mechanism 60 is vertically movable between a lowered position (see FIG. 2) at which the cover mechanism 60 covers the wafer W from above, and a raised position (see FIG. 3) that is positioned higher than the lowered position. As described in detail below, when a chemical liquid, such as an SPM liquid, is discharged onto an upper surface of the wafer W, the cover mechanism 60 covers the wafer W from above, in order to prevent the chemical liquid from diffusing over a wide range in the chamber 20.

Concrete means for vertically moving the cover mechanism 60 is not specifically limited. For example, as shown in FIGS. 2 and 3, the cover mechanism 60 is vertically moved by a vertical driving mechanism 78 including: a vertically extending support unit 78c disposed outside the chamber 20; a movable unit 78b vertically driven along the support unit 78c; and an arm 78a whose one end is fixed on the movable unit 78b and the other end is fixed on the cover mechanism 60. In this case, concrete means for vertically moving the movable unit 78b is not specifically limited, and known driving means such as an air cylinder or a motor may be used. In addition, an opening (not shown) is formed in a side wall of the chamber 20 in an area through which the arm 78a of the vertical driving mechanism 78 passes.

As shown in FIGS. 2 and 3, the liquid processing apparatus 10 further includes a shielding mechanism 30 that is horizontally movable between a position (advanced position described below) in the chamber 20 and a position (retracted position described below) in the waiting room 80. As described in detail below, the shielding mechanism 30 includes an air hood 31 configured to form a downflow of a clean gas so as to clean an atmosphere around the wafer W, when the wafer W is subjected to a cleaning/drying process, and a cleaning vessel 32 disposed above the air hood 31.

Concrete means for horizontally moving the shielding mechanism 30 is not specifically limited. For example, as shown in FIGS. 2 and 3, the shielding mechanism 30 is horizontally moved by a horizontal driving mechanism 35 including: a horizontally extending support unit 35c disposed outside the chamber 20; a movable unit 35b horizontally driven along the support unit 35c; and an arm 35a whose one end is fixed on the movable unit 35b and the other end is fixed on the shielding mechanism 30. In this case, concrete means for horizontally moving the movable unit 35b is not specifically limited, and known driving means such as an air cylinder or a motor may be used. In addition, an opening (not shown) is formed in the side wall of the chamber 20 in an area through which the arm 35a of the horizontal driving mechanism 35 and the shielding mechanism 30 pass.

According to this embodiment, when the wafer W is subjected to the SPM process, the cover mechanism 60 can prevent a fume generated by the SPM liquid from diffusing over a wide range in the chamber 20. In addition, when the wafer W is subjected to the SPM process and the cleaning/ drying process, the shielding mechanism 30 is positioned between the wafer W and the cover mechanism 60, whereby the shielding mechanism 30 can vertically shield the wafer W from the cover mechanism 60. Thus, since falling down of liquid drops and/or droplets of a chemical liquid adhering to the cover mechanism onto the wafer W can be shielded by the shielding mechanism 30, contamination of the wafer W can be prevented. Therefore, according to this embodiment, the SPM process and the cleaning/drying process can be performed in the same chamber 20.

Figure 4A:
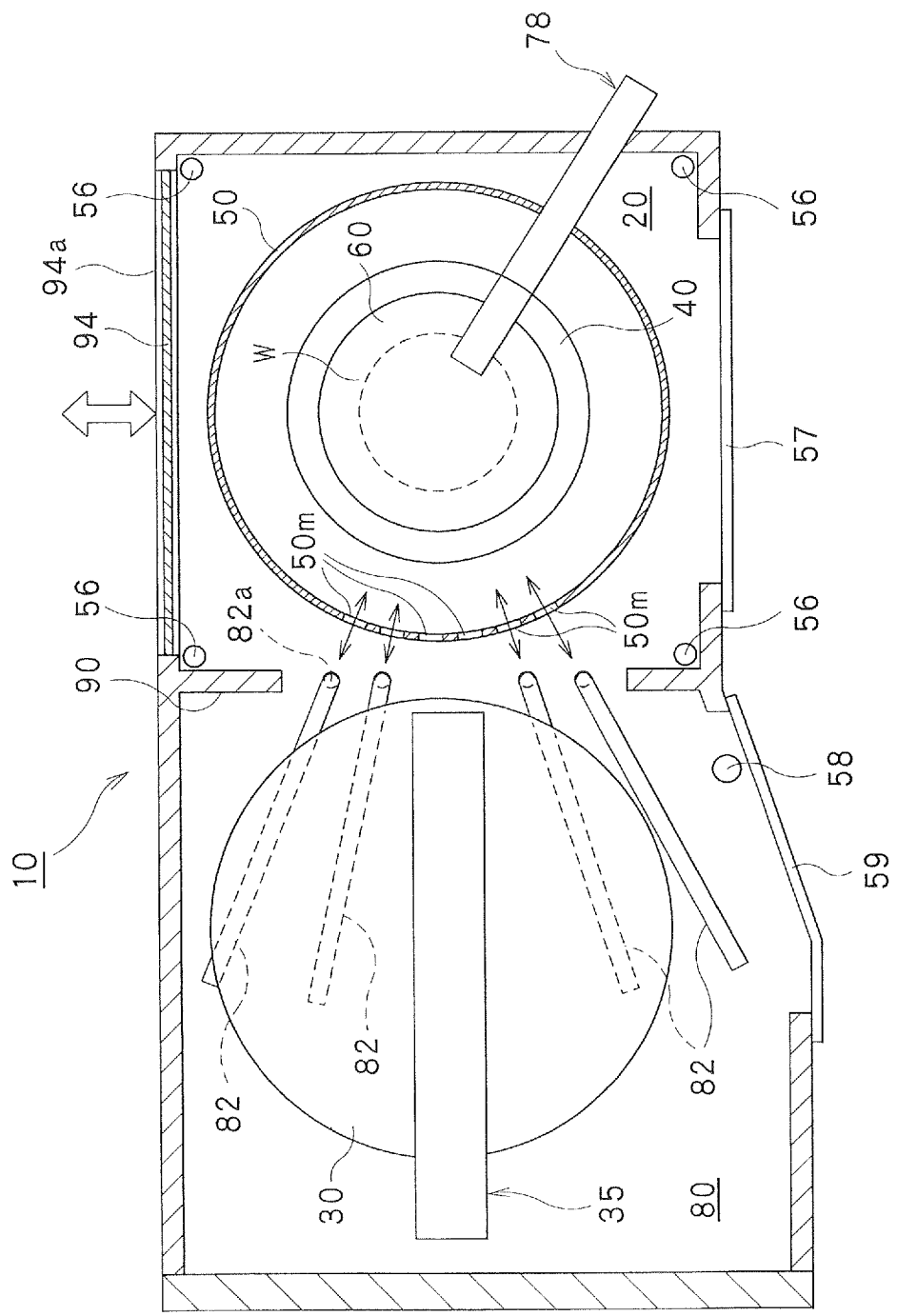
FIG. 4A is a plan view showing the liquid processing apparatus according to the embodiment of the present invention, in which the cover mechanism is situated on the lowered position and the shielding mechanism is situated on the retracted position.
Figure 4B:
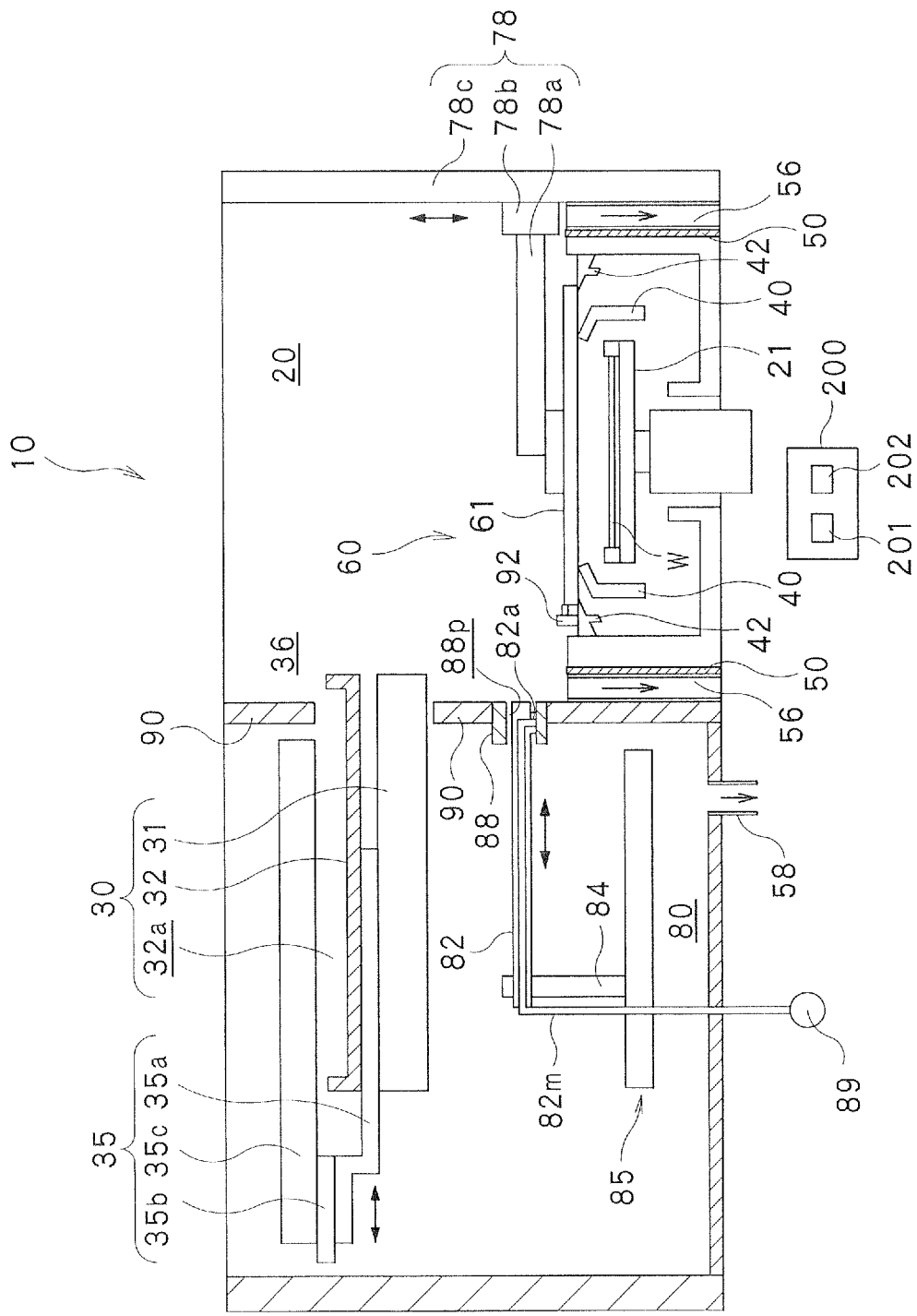
FIG. 4B is a sectional view of the liquid processing apparatus shown in FIG. 4A.
Figure 5A:
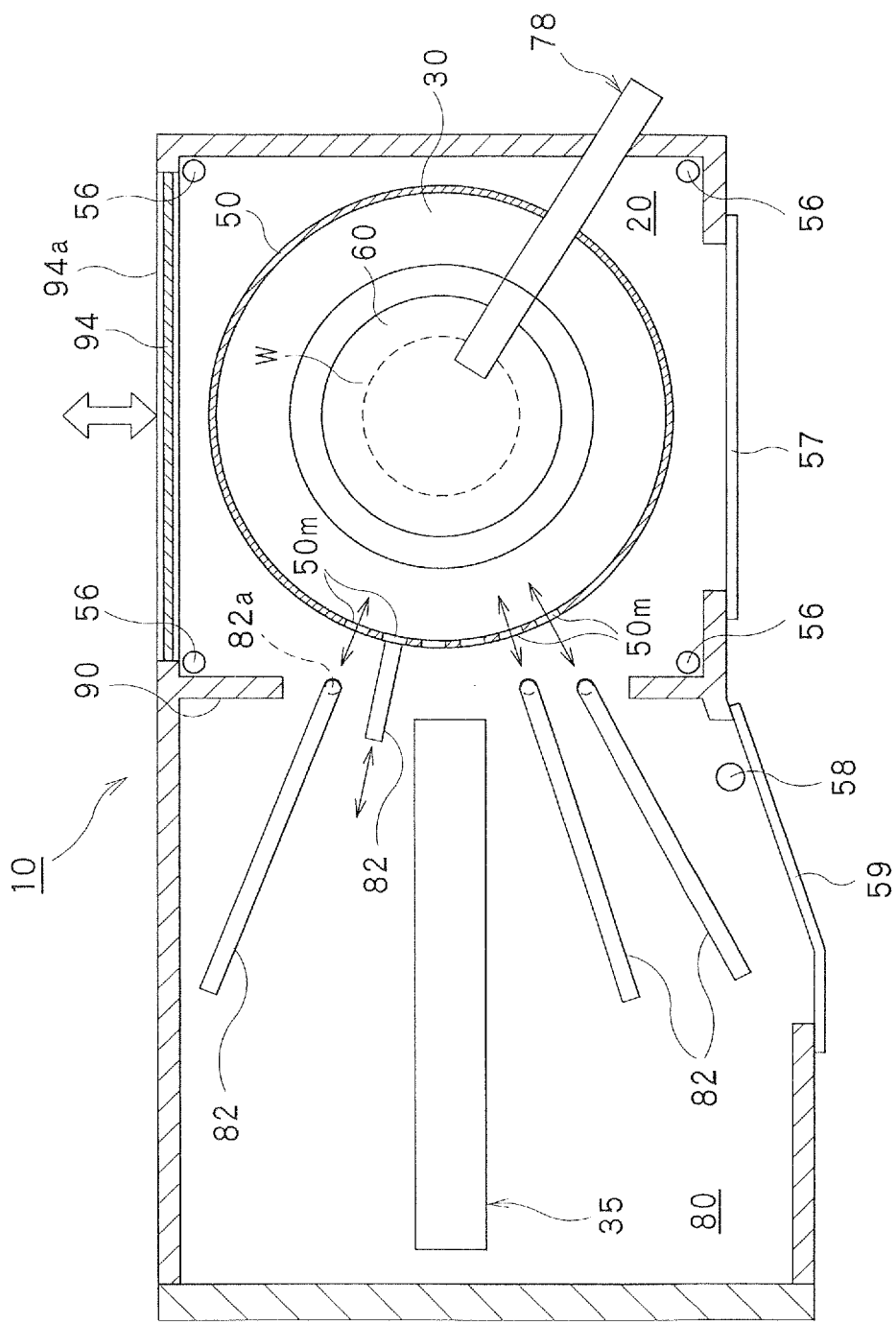
FIG. 5A is a plan view showing the liquid processing apparatus according to the embodiment of the present invention, in which the cover mechanism is situated on the raised position and the shielding mechanism is situated on the advanced position.
Figure 5B:
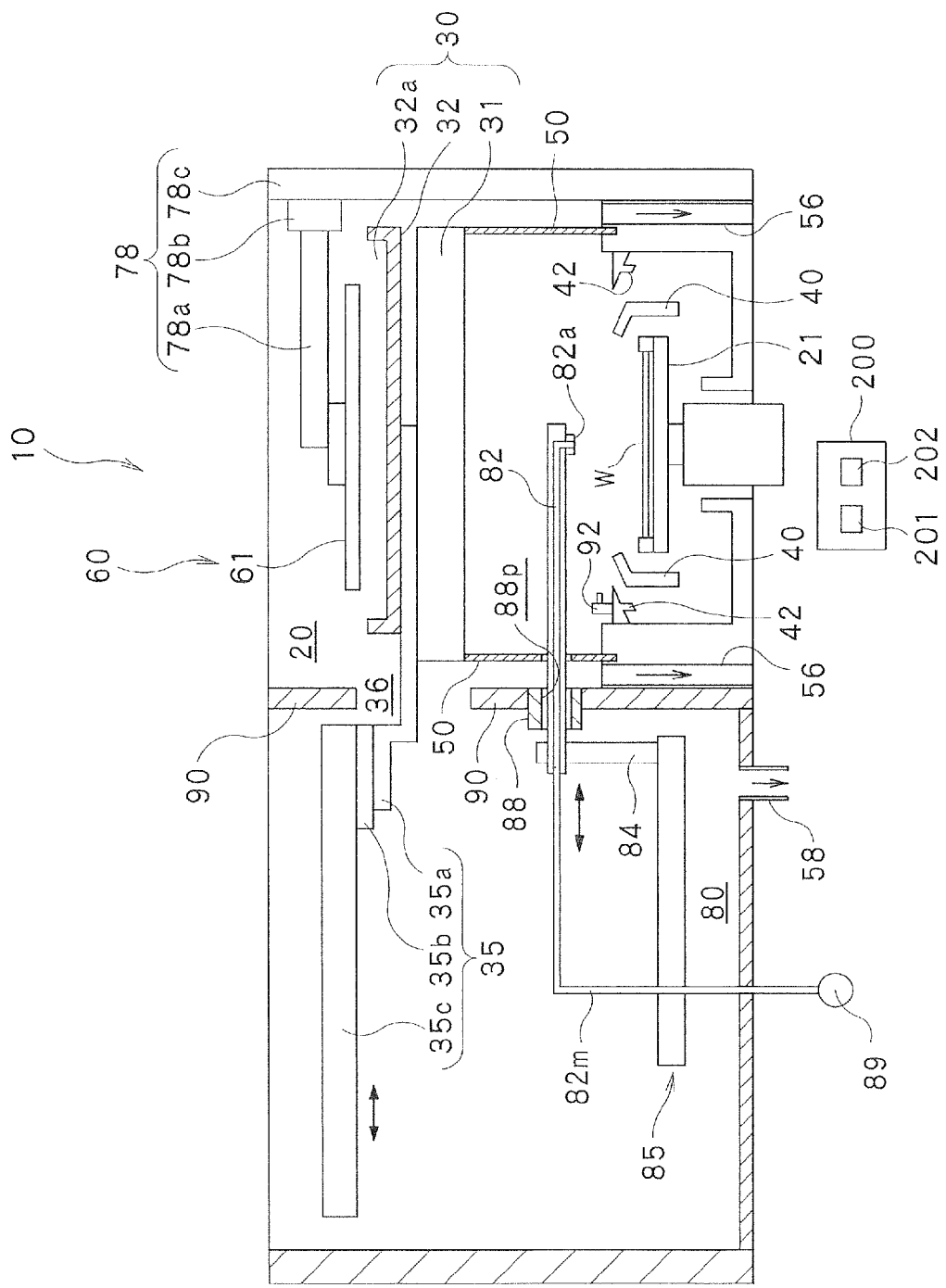
FIG. 5B is a sectional view of the liquid processing apparatus shown in FIG. 5A.

The structure of the liquid processing apparatus 10 having such a feature is described in detail below with reference to FIGS. 4A to 5B. FIGS. 4A and 4B are a plan view and a vertical sectional view of the liquid processing apparatus 10, in which the cover mechanism 60 is situated on the lowered position and the shielding mechanism 30 is situated on the retracted position. FIGS. 5A and 5B are a plan view and a vertical sectional view of the liquid processing apparatus 10, in which the cover member 60 is situated on the raised position and the shielding mechanism 30 is situated on the advanced position.

As shown in FIG. 4B, the liquid processing apparatus 10 includes a substrate retaining unit 21 configured to horizontally retain a wafer W and to rotate the same, the aforementioned cover mechanism 60 vertically movable depending on a process condition of the wafer W, and the aforementioned shielding mechanism 30 horizontally movable depending on a process condition of the wafer W. As described below, disposed on the cover mechanism 60 is a process-fluid nozzle 65 having a discharge opening through which the SPM liquid is discharged from above onto the upper surface of the wafer W. As described below, the process-fluid nozzle 65 may have a discharge opening through which not only the SPM liquid but also another process fluid, such as a DIW (deionized water) and a gas, is discharged onto the upper surface of the wafer W. Connected to the process-fluid nozzle 65 is a process-fluid supply mechanism 70 configured to supply the process-fluid nozzle 65 with a chemical liquid and another process fluid.

As shown in FIG. 4B, a rotatable cup 40 having an opening in an upper part thereof is disposed around the substrate retaining unit 21. The rotatable cup 40 is structured such that the rotatable cup 40 surrounds the substrate retaining unit 21 and is rotated together with the substrate retaining unit 21. When the cover mechanism 60 is situated on the lowered position, the rotatable cup 40 and the aforementioned cover mechanism 60 are structured such that the cover mechanism 60 covers the upper opening of the rotatable cup 40.

As shown in FIGS. 4A and 4B, a cylindrical outer cup 50, which is structured to surround the wafer W, the substrate retaining unit 21 and the rotatable cup 40, is arranged around the rotatable cup 40. Depending on a process condition of the wafer W, the cylindrical outer cup 50 is vertically movable between a cup-lowered position shown in FIG. 4B and a cup-raised position shown in FIG. 5B. The detailed structure of the cylindrical outer cup 50 is described below.

The liquid processing apparatus 10 is provided with a nozzle (movable nozzle) 82a for supplying a fluid, such as a process liquid or an $N_2$ gas, to the wafer W held by the substrate retaining unit 21 from above the wafer W, and a nozzle support arm 82 supporting the nozzle 82a. As shown in FIGS. 4A and 5A, each liquid processing apparatus 10 has the plurality of (specifically, e.g., four) nozzle support arms 82. The nozzle 82a is provided on a distal end of each nozzle support arm 82. As shown in FIGS. 4B and 5B, each nozzle support arm 82 is provided with an arm supporter 84. Each arm supporter 84 is driven by an arm driving mechanism 85 in the right and left direction in FIGS. 4B and 5B. Thus, each nozzle support arm 82 can be linearly moved in the horizontal direction between a nozzle advanced position at which the nozzle 82a is present in the chamber 20, and a nozzle retracted position at which the nozzle 82a is retracted from the chamber 20. (See the arrows on the respective nozzle support arms 82 in FIGS. 4A to 5B.) As shown in FIGS. 4B and 5B, each nozzle support arm 82 is provided with a surface-process-liquid supply pipe 82m. Each surface-process-liquid supply pipe 82m is connected to a surface-process-liquid supply unit 89. A fluid, such as a process liquid or an $N_2$ gas, is supplied from the surface-process-liquid supply unit 89 to the nozzles 82a of the respective nozzle support arms 82 through the respective surface-process-liquid supply pipes 82m.

As shown in FIGS. 4A and 4B, these nozzle support arms 82 and the aforementioned shielding mechanism 30 are controlled to wait in the waiting room 80 formed adjacently to the chamber 20, depending on a process condition of the wafer W.

In addition to the aforementioned horizontally movable nozzles 82a, there may be further provided a fixed nozzle 92 fixed in the chamber 20, as shown in FIG. 4B. The fixed nozzle 92 is arranged so as to be positioned inside the cylindrical outer cup 50. As described below, the fixed nozzle 92 is structured to supply a process liquid such as a DIW to the wafer W, while the shielding mechanism 30 is being horizontally moved. FIG. 4B shows an example in which the fixed nozzle 92 is disposed on a below-described drain cup 42. However, a member on which the fixed nozzle 92 is disposed is not limited to the drain cup 42, and the fixed nozzle 92 can be disposed on various members positioned inside the cylindrical outer cup 50.

As shown in FIGS. 4A to 5B, an exhaust unit 56 is disposed on a bottom part of the chamber 20 outside the cylindrical outer cup 50. An atmosphere in the chamber 20 is discharged by the exhaust unit 56. To be specific, the exhaust unit 56 restrains that an atmosphere in the waiting room 80 enters the cylindrical outer cup 50. In addition, the exhaust unit 56 restrains that an atmosphere in the cylindrical outer cup 50 leaks to the waiting room 80.

As shown in FIGS. 4A to 5B, an exhaust unit 58 is disposed on a bottom part of the waiting room 80. An atmosphere in the waiting room 80 is discharged by the exhaust unit 58. To be specific, particles, which are possibly generated when the respective nozzle support arms 82 are driven, can be discharged by the exhaust unit 58.

As shown in FIGS. 4A and 5A, shutters 57 and 59 for maintenance are respectively disposed on entrances of the chamber 20 and the waiting room 80 of the liquid processing apparatus 10. Thus, equipments in the chamber 20 and the waiting room 80 can be independently maintained.

As shown in FIGS. 4A and 5A, the side wall of the chamber 20 has an opening 94a through which the wafer W is loaded into the chamber 20 and the wafer W is unloaded from the chamber 20 by the transport arm 104. The opening 94a is provided with a shutter 94 for opening and closing the opening 94a.

Next, details of the respective constituent elements of the liquid processing apparatus 10 are described below.

(Substrate Retaining Unit)

Figure 6:
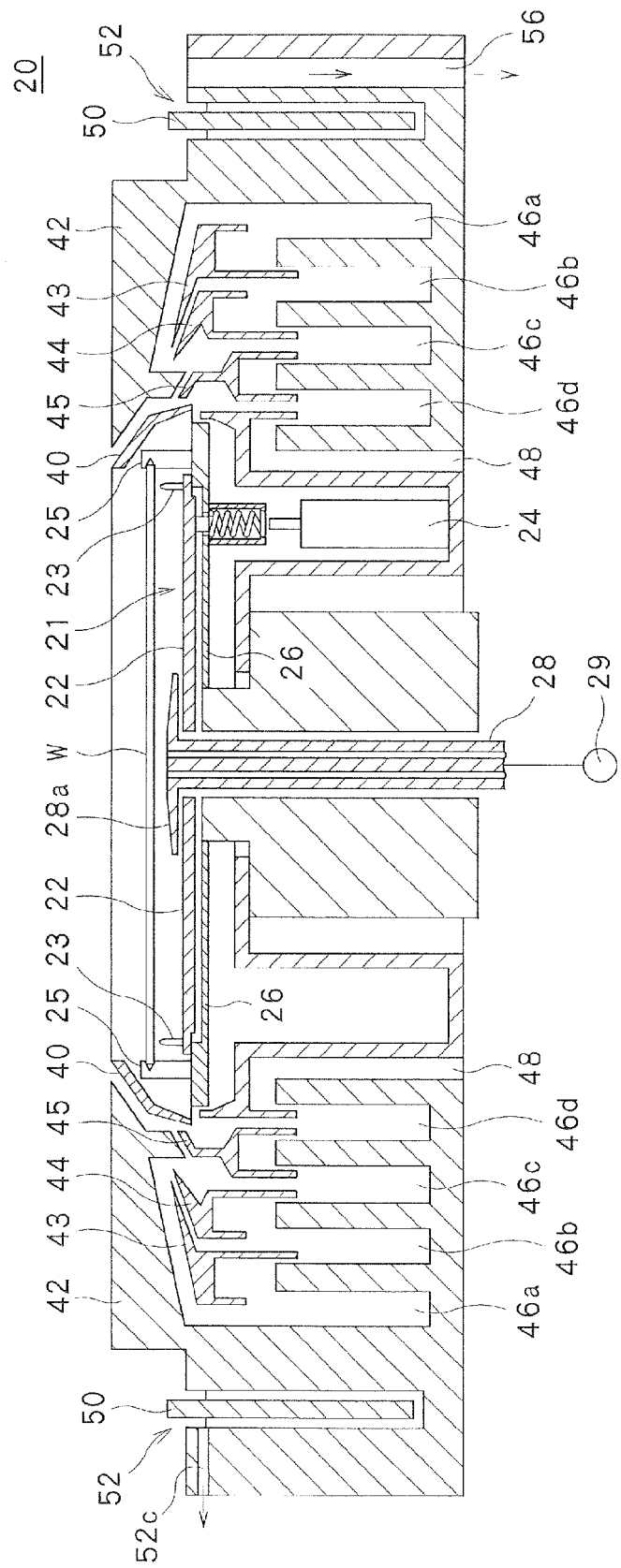
FIG. 6 is a sectional view showing a substrate retaining unit of the liquid processing apparatus and constituent elements around it.

The substrate retaining unit 21 is firstly described with reference to FIG. 6. FIG. 6 is a vertical sectional view showing the substrate retaining unit 21 and the constituent elements located around the same, among the respective constituent elements of the liquid processing apparatus 10.

As shown in FIG. 6, the substrate retaining unit 21 includes a discoid retaining plate 26 for retaining the wafer W, and a discoid lift-pin plate 22 disposed above the retaining plate 26.

On an upper surface of the lift-pin plate 22, three lift pins 23 for supporting the wafer W from below are arranged at intervals circumferentially equal to each other. In FIG. 6, only the two lift pins 23 are illustrated. The lift-pin plate 22 has a piston mechanism 24. The lift-pin plate 22 is raised or lowered by the piston mechanism 24. To be more specific, when the wafer W is placed on the lift pins 23 or the wafer W is removed from the lift pins 23 by the transport arm 104 (see FIG. 1), the lift-pin plate 22 is moved upward by the piston mechanism 24 from the position shown in FIG. 6, whereby the lift-pin plate 22 is positioned higher than the rotatable cup 40. On the other hand, when the wafer W is subjected to a liquid process in the chamber 20, the lift-pin plate 22 is moved by the piston mechanism 24 to a lowered position shown in FIG. 6, whereby the rotatable cup 40 is positioned around the wafer W.

The retaining plate 26 is provided with three retaining members 25 for supporting the wafer W from the lateral side, which are circumferentially arranged with equal intervals therebetween. FIG. 6 illustrates only the two retaining members 25. When the lift-pin plate 22 is moved from the upper position to the lower position shown in FIG. 6, the respective retaining members 25 support the wafer W on the lift pins 23, so that the wafer W can be slightly spaced apart from the lift pins 23.

As shown in FIG. 6, the aforementioned rotatable cup 40 is disposed on the retaining plate 26, so that the rotatable cup 40 can be rotated integrally with the retaining plate 26. As shown in FIG. 6, the rotatable cup 40 is arranged so as to surround the wafer W supported by the respective retaining members 25 of the retaining plate 26 from the lateral side. Thus, when the wafer W is subjected to a liquid process, the rotatable cup 40 can receive a process liquid scattering laterally from the wafer W.

(Drain Cup and Guide Cup)

Around the rotatable cup 40, there are provided the drain cup 42, a first guide cup 43, a second guide cup 44 and a third guide cup 45 in this order from above. The drain cup 42 and the guide cups 43, 44 and 45 are respectively formed to have a ring shape. The drain cup 42 and the guide cups 43, 44 and 45 have upper openings, respectively. The drain cup 42 is fixed on the chamber 20. On the other hand, elevation cylinders (not shown) are respectively connected to the guide cups 43, 44 and 45, so that the guide cups 43, 44 and 45 can be raised or lowered independently of each other.

As shown in FIG. 6, a first process-liquid collecting tank 46a, a second process-liquid collecting tank 46b, a third process-liquid collecting tank 46c and a fourth process-liquid collecting tank 46d are respectively disposed below the drain cup 42 and the guide cups 43, 44 and 45. When the wafer W is subjected to a liquid process, a process liquid scattering laterally from the wafer W is selectively sent to any one of the four process-liquid collecting tanks 46a, 46b, 46c and 46d, by changing the vertical positions of the respective guide cups 43, 44 and 45 based on a kind of the process liquid.

As shown in FIG. 6, an exhaust unit 48 is disposed inside the fourth process-liquid collecting tank 46d. An atmosphere around the wafer W can be discharged by locating the respective guide cups 43, 44 and 45 on vertically predetermined positions. The exhaust unit 48 can discharge not only the atmosphere around the wafer W but also an atmosphere in the chamber 20 so as to replace the atmosphere in the chamber 20.

(Cylindrical Outer Cup)

Figure 7:
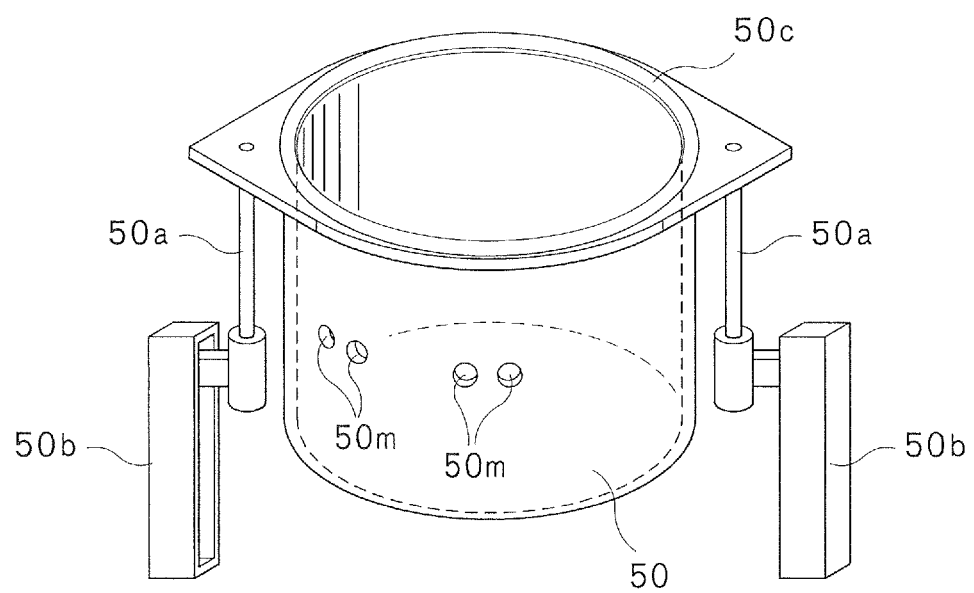
FIG. 7 is a perspective view showing a cylindrical outer cup.

As shown in FIG. 6, the aforementioned cylindrical outer cup 50 is disposed around the drain cup 42 and the respective guide cups 43, 44 and 45. The cylindrical outer cup 50 is described in detail with reference to FIG. 7. FIG. 7 is a perspective view of the cylindrical outer cup 50.

As shown in FIG. 7, in accordance with the number of the nozzle support arms 82, side openings 50m through which the nozzle support arms 82 can pass are formed in a side surface of the cylindrical outer cup 50. For example, when the number of the nozzle support arms 82 is four, there are provided the four side openings 50m. A support member 50a for supporting the cylindrical outer cup 50 is connected to an upper part of the cylindrical outer cup 50. A driving mechanism 50b for raising or lowering the support member 50a is disposed on the support member 50a. By raising or lowering the support member 50a by means of the driving mechanism 50b, the cylindrical outer cup 50 supported by the support member 50a can be raised or lowered.

An opening (upper opening) is formed in the upper part of the cylindrical outer cup 50. When the cylindrical outer cup 50 is situated on the cup raised position, the upper opening is located close to or in contact with the air hood 31 of the shielding mechanism 30 situated on the advanced position. Namely, when the shielding mechanism 30 is situated on the advanced position, a space defined inside the air hood 31 and the cylindrical outer cup 50 is isolated from outside. As described below, various processes, which are performed by discharging a process liquid such as a DIW onto the wafer W from the nozzles 82a, are performed in this space isolated from outside by the air hood 31 and the cylindrical outer cup 50. In the below description, the space, which is defined inside the air hood 31 and the cylindrical outer cup 50 so as to be isolated from outside, is referred to as "processing space".

There are mainly supposed the following two advantages that are obtained by defining the above processing space. One advantage is that, since the processing space is isolated from outside, an atmosphere in the processing space can be prevented from going outside and an outside atmosphere can be prevented from coming into the processing space. The other advantage is that, since the processing space is a closed space, a volume of the space where a process is performed can be reduced, to thereby enhance process efficiency. For example, it is possible to advantageously enhance a replacement efficiency of the atmosphere to a clean gas in the processing space during a process.

In the liquid processing apparatus shown in FIG. 5B, an area within the cylindrical outer cup 50 in the chamber 20 has a slight positive pressure with respect to a clean room. On the other hand, an area outside the cylindrical outer cup 50 in the chamber 20 has a slight negative pressure with respect to the clean room. Thus, in the chamber 20, an air pressure of the area inside the cylindrical outer cup 50 is higher than an air pressure of the area outside the cylindrical outer cup 50.

As shown in FIG. 7, a seal member is disposed on the upper part of the cylindrical outer cup 50. When the shielding mechanism 30 is situated on the advanced position, the seal member is interposed between the cylindrical outer cup 50 and the air hood 31. Due to the provision of the seal member, the processing space defined inside the air hood 31 and the cylindrical outer cup 50 can be more securely isolated from outside. A concrete structure of the seal member is not specifically limited. For example, as shown in FIG. 7, the seal member is formed of an O-ring 50c attached to the upper surface of the cylindrical outer cup 50.

(Cover Member)

Next, the cover member 60 is described in detail. As shown in FIGS. 4B and 5B, the cover mechanism 60 includes the discoid top plate 61 having a diameter larger than at least the diameter of the wafer W. Preferably, the top plate 61 has a shape and dimensions sufficient for completely covering the opening formed in the upper part of the aforementioned rotatable cup 40 and the opening formed in the upper part of the drain cup 42. In the illustrated example, the top plate 61 has a discoid shape having a diameter slightly larger than the diameter of the opening formed in the upper part of the drain cup 42.

Figure 8A:
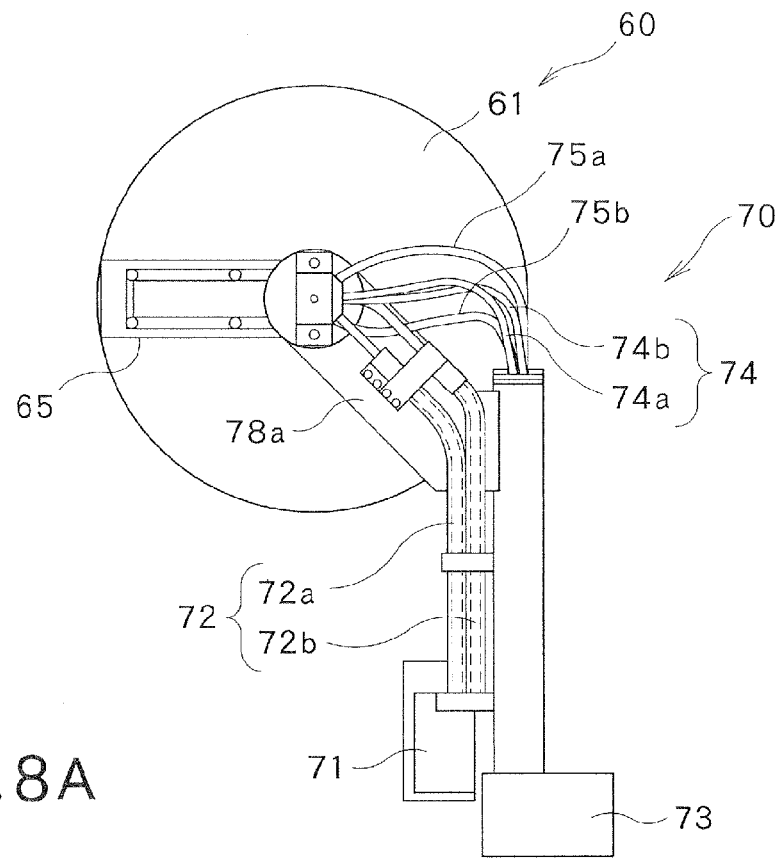
FIG. 8A is a plan view showing a top plate of the cover mechanism.
Figure 8B:
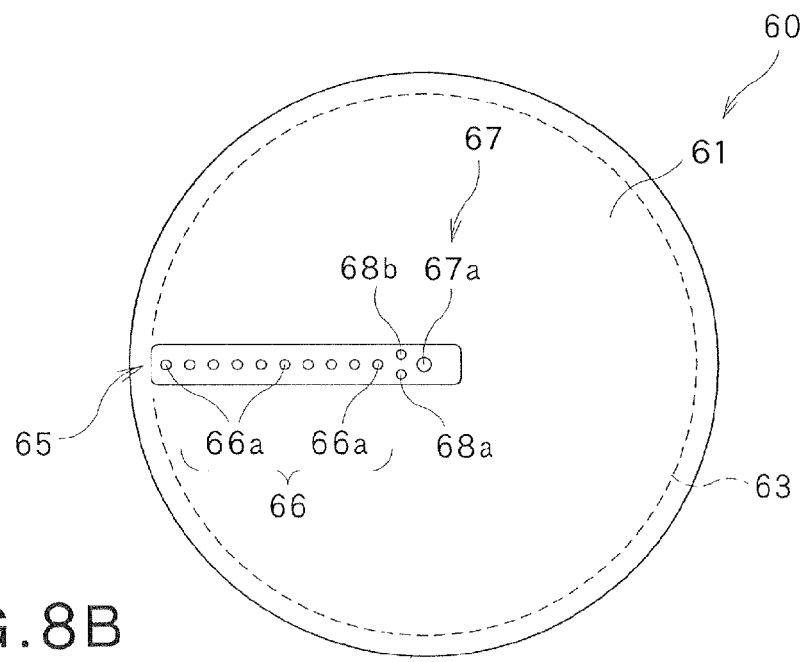
FIG. 8B is a bottom view showing the top plate of the cover mechanism.

FIGS. 8A and 8B are a plan view and a bottom view, respectively, showing the top plate 61. As shown in FIGS. 8A and 8B, the top plate 61 includes the process-fluid nozzle 65 having a discharge opening for discharging the SPM liquid onto the upper surface of the wafer W. As shown in FIG. 8B, the process-fluid nozzle 65 incorporates a center nozzle 67 disposed on a central portion of the top plate 61, and a bar nozzle (perforated nozzle) 66 extending from the central portion of the top plate 61 to a peripheral portion of the top plate 61. The center nozzle 67 has a center discharge opening 67a disposed on the central portion of the top plate 61, for discharging the SPM liquid toward the upper surface of the wafer W. The bar nozzle 66 has a plurality of discharge openings 66a arranged between the central portion of the top plate 61 and the peripheral portion of the top plate 61, for discharging the SPM liquid toward the upper surface of the wafer W. Namely, these discharge openings 66a are arranged between a position opposed to the central portion of the wafer W and a position opposed to the peripheral portion of the wafer W. Details of the structure of such a process-fluid nozzle 65 will be detailed below.

As shown in FIG. 8B, near to the center discharge opening 67a of the center nozzle 67, there may be further provided a gas discharge opening 68a for blowing an inert gas onto the upper surface of the wafer W and a cleaning-liquid discharge opening 68b for discharging a deionized water heated to a high temperature (HOT-DIW) onto the upper surface of the wafer W.

(Process-Fluid Supply Mechanism)

As shown in FIG. 8A, disposed near to the top plate 61 is the process-fluid supply mechanism 70 configured to supply the SPM liquid, the inert gas and the HOT-DIW to the process-fluid nozzle 65. The process-fluid supply mechanism 70 is described in detail herebelow with reference to FIGS. 8A and 9A.

<SPM Liquid>

The SPM liquid to be supplied from the process-fluid supply mechanism 70 to the process-fluid nozzle 65 is firstly described. The SPM liquid is a mixed chemical liquid obtained by mixing sulfuric acid solution (first chemical liquid) and hydrogen peroxide solution (second chemical liquid). Preferably, the mixture of the sulfuric acid solution and the hydrogen peroxide solution is performed in the vicinity of the process-fluid nozzle 65 or inside the process-fluid nozzle 65.

<Supply Source and Supply Pipe>

As shown in FIG. 8A, the process-fluid supply mechanism 70 includes a first supply source 71 configured to accommodate the sulfuric acid solution (first chemical liquid), a first supply pipe 72 configured to supply the sulfuric acid solution from the first supply source 71 to the process-fluid nozzle 65, a second supply source 73 configured to accommodate the hydrogen peroxide solution, and a second supply pipe 74 configured to supply the hydrogen peroxide solution from the second supply source 73 to the process-fluid nozzle 65. The first supply pipe 72 has a first supply pipe for bar nozzle 72a configured to supply the sulfuric acid solution to the bar nozzle 66, and a first supply pipe for center nozzle 72b configured to supply the sulfuric acid solution to the center nozzle 67. In addition, the second supply pipe 74 has a second supply pipe for bar nozzle 74a configured to supply the hydrogen peroxide solution to the bar nozzle 66, and a second supply pipe for center nozzle 74b configured to supply the hydrogen peroxide solution to the center nozzle 67. These supply sources 71 and 73 are fixed on predetermined positions inside or outside the chamber 20.

A flow rate of the sulfuric acid solution to be supplied from the first supply source 71 to the bar nozzle 66 through the first supply pipe for bar nozzle 72a, and a flow rate of the sulfuric acid solution to be supplied from first supply source 71 to the center nozzle 67 through the first supply pipe for center nozzle 72b can be controlled independently of each other. Similarly, a flow rate of the hydrogen peroxide solution to be supplied from the second supply source 73 to the bar nozzle 66 through the second supply pipe for bar nozzle 74a, and a flow rate of the hydrogen peroxide solution to be supplied from the second supply source 73 to the center nozzle 67 through the second supply pipe for center nozzle 74b can be controlled independently of each other.

The process-fluid supply mechanism 70 may further include a gas supply pipe 75a configured to supply the inert gas from an inert-gas supply source (not shown) to the gas discharge opening 68a, and a cleaning-liquid supply pipe 75b configured to supply the HOT-DIW from a HOT-DIW supply source (not shown) to the cleaning-liquid discharge opening 68b.

These supply pipes 72a, 72b, 74a, 74b, 75a and 75b are formed of a material having a predetermined flexibility, such that they can follow the vertical movement of the cover mechanism 60. As described below, the sulfuric acid solution to be supplied to the process-fluid nozzle 65 passes through the first supply pipe 72, while the sulfuric acid solution is being heated to a temperature as high as 140 to 200 degrees Celsius. Thus, the first supply pipe for bar nozzle 72a and the first supply pipe for center nozzle 72b of the first supply pipe 72 are formed of a material having both a suitably predetermined flexibility and a suitably predetermined heat resistance. For example, these pipes are formed of PFA (tetrafluoroethylene perfluoroalkylvinylether copolymer).

Figure 9A:
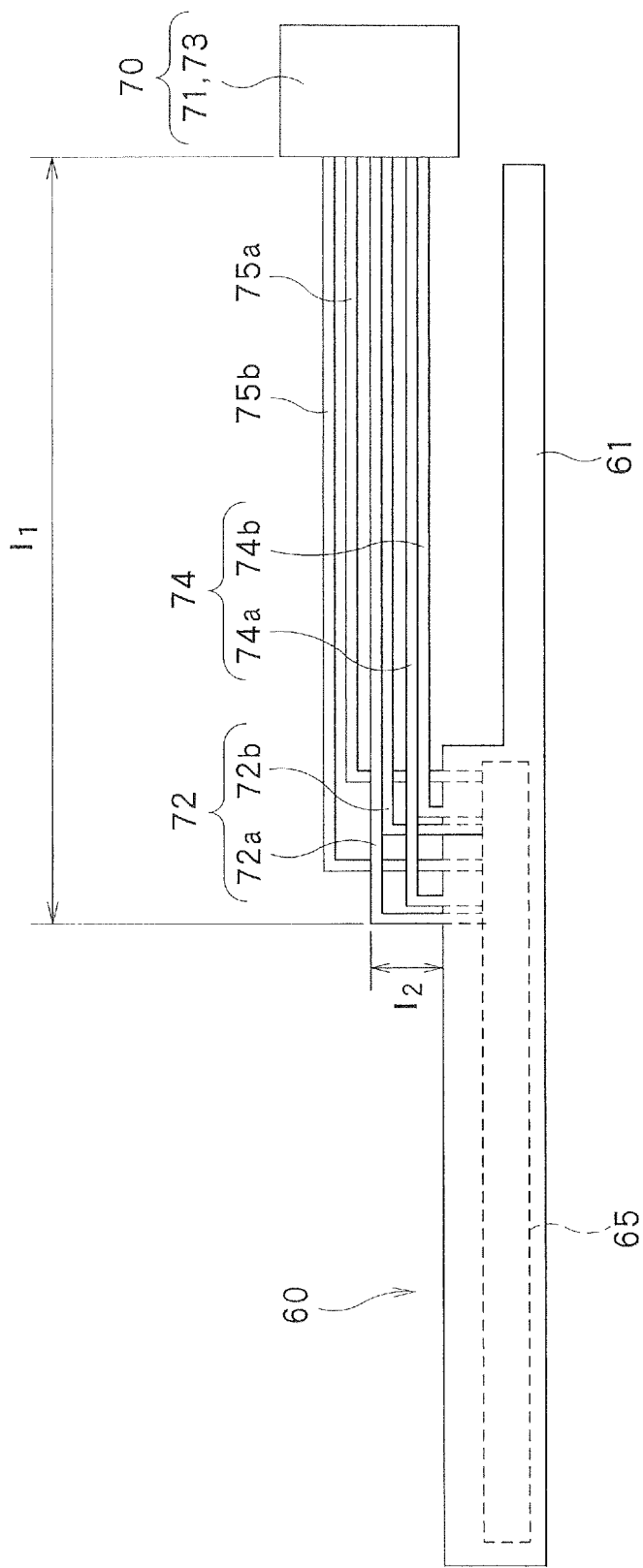
FIG. 9A is a side view showing the cover mechanism and a process-fluid supply mechanism.

FIG. 9A is a view of the cover mechanism 60 and the process-fluid supply mechanism 70 seen from the lateral side. As shown in FIG. 9A, the respective supply pipes 72a, 72b, 74a, 74b, 75a and 75b are extended substantially horizontally. Herein, "to be extended substantially horizontally" means that, as shown by the first supply pipe for bar nozzle 72a in FIG. 9A, for example, between the first supply source 71 and the process-fluid nozzle 65, a horizontal extension range $l_1$ of the first supply pipe for bar nozzle 72a is larger than a vertical extension range $l_2$ thereof.

FIG. 8A shows the example in which the respective supply pipes 72a, 72b, 74a, 74b, 75a and 75b are partially fixed on the arm 78a of the vertical driving mechanism 78. However, the routes of the respective supply pipes 72a, 72b, 74a, 74b, 75a and 75b from the respective supply sources to the process-fluid nozzle 65 are not specifically limited, and can be suitably set depending on the layout of the respective supply sources.

(Process-Fluid Nozzle)

Figure 9B:
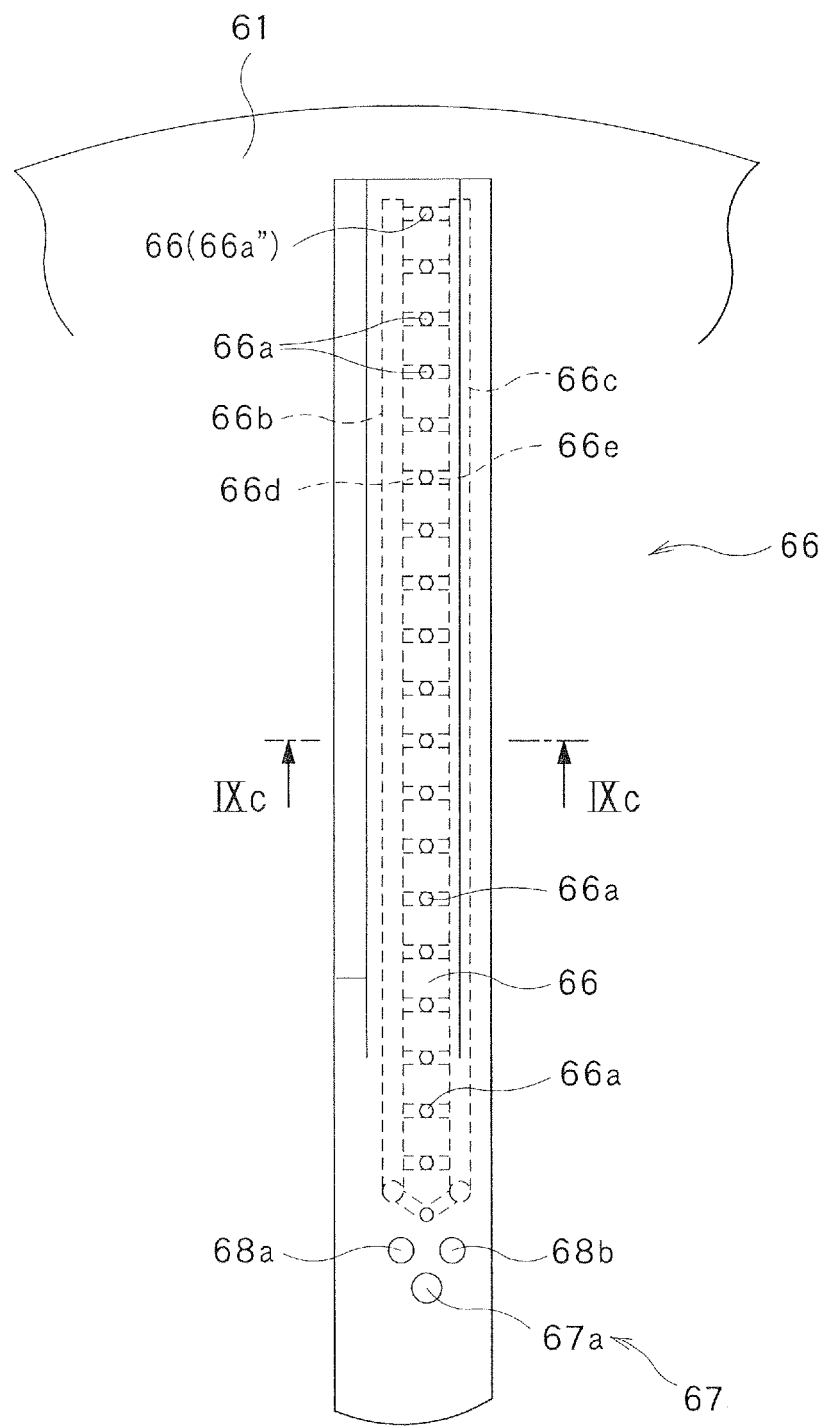
FIG. 9B is a bottom view showing a process-fluid nozzle incorporated in the top plate.

Next, the process-fluid nozzle 65 is described in detail with reference to FIGS. 9B and 9C. FIG. 9B is a bottom view of the process-fluid nozzle 65 incorporated in the top plate 61, which is seen from below.

<Bar Nozzle>

The bar nozzle 66 is firstly described. As shown by the broken lines in FIG. 9B, formed in the bar nozzle 66 are a fluid path (sulfuric acid solution path) 66b communicated with the first supply pipe for bar nozzle 72a for supplying the sulfuric acid solution, a fluid path (hydrogen-peroxide-solution path)

66c communicated with the second supply pipe for bar nozzle 74a for supplying the hydrogen peroxide solution. As shown by the broken lines in FIG. 9B, the sulfuric acid solution path 66b and the hydrogen-peroxide-solution path 66c are horizontally extended in parallel with each other, from the central side of the top plate 61 to the peripheral side of the top plate 61, along the longitudinal direction of the bar nozzle 66.

Next, a mechanism of the discharge openings 66a of the bar nozzle 66 for discharging the SPM liquid is described with reference to FIG. 9C. FIG. 9C is a sectional view showing an inside structure of the bar nozzle 66 along the line IXc-IXc in FIG. 9B.

Figure 9C:
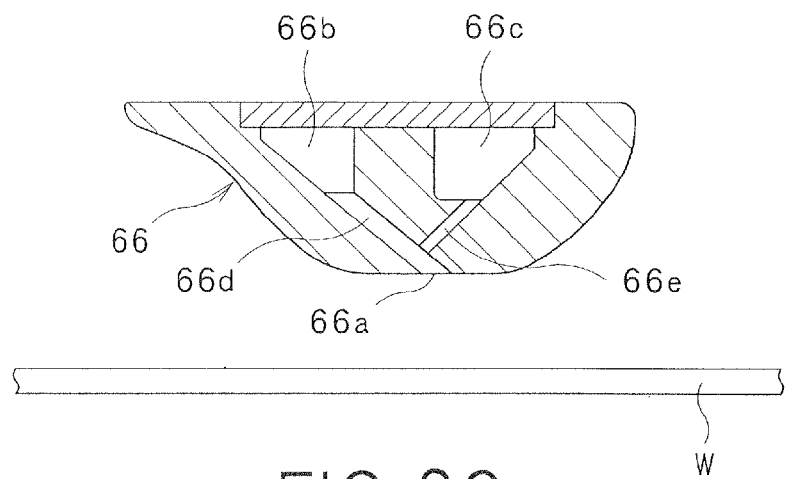
FIG. 9C is a sectional view showing an inside structure of a bar nozzle along the line IXc-IXc in FIG. 9B.

As shown in FIG. 9C, in the bar nozzle 66, one sulfuric-acid-solution discharge path 66d is connected to the sulfuric-acid-solution path 66b, and one hydrogen-peroxide-solution discharge path 66e is connected to the hydrogen-peroxide-solution path 66c, correspondingly to each of the discharge openings 66a. In addition, as shown in FIG. 9C, at a position in front of the discharge opening 66a where the sulfuric acid solution discharge path 66d ends, the hydrogen-peroxide-solution discharge path 66e is merged to the sulfuric acid solution discharge path 66d. Thus, the SPM liquid, which has been just generated by mixing the sulfuric acid solution and the hydrogen peroxide solution, is discharged from each discharge opening 66a. In this manner, since the sulfuric acid solution and the hydrogen peroxide solution are mixed with each other in the vicinity of each discharge opening 66a, the SPM liquid, whose temperature has been just increased by a chemical reaction caused by the mixture, can be discharged from each of the discharge openings 66a.

<Center Nozzle>

Next, the center nozzle 67 is described. Similarly to the bar nozzle 66, the center nozzle 67 is provided with a sulfuric acid solution path (not shown) communicated with the first supply pipe for center nozzle 72b for supplying the sulfuric acid solution, and a hydrogen-peroxide-solution path communicated with the second supply pipe for center nozzle 74b for supplying the hydrogen peroxide solution. The SPM liquid, which has been generated by mixing the sulfuric acid solution and the hydrogen peroxide solution in the vicinity of the center discharge opening 67a, is discharged from the center discharge opening 67a.

<Heater>

Next, a heater provided on the top plate 61 is described. The SPM liquid is discharged onto the upper surface of the wafer W in order to remove a resist film formed on the upper surface of the wafer W. At this time, the higher the temperature of the SPM liquid is, the higher the ability of the SPM liquid for removing the resist film is. Thus, during the SPM process, it is preferable that the temperature of the SPM liquid is increased by heating the wafer W and the resist film. For example, the temperature of the wafer W and the resist film is preferably higher than the temperature of the SPM liquid that is discharged from the respective discharge openings 66a. In this case, the temperature of the SPM liquid having been supplied to the wafer W can be further increased, whereby the ability of the SPM liquid for removing the resist film can be enhanced. In order to achieve this heating, in this embodiment, a heater configured to heat the wafer W and the resist film is provided on the top plate 61 of the cover mechanism 60. Such a heater is described herebelow with reference to FIGS. 8B and 9D.

Figure 9D:
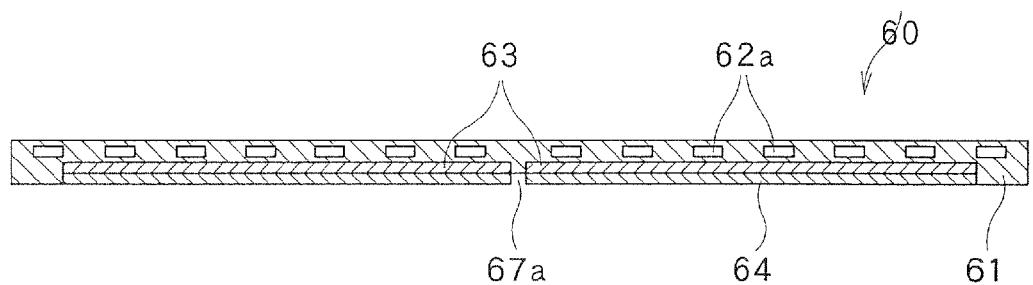
FIG. 9D is a vertical sectional view showing the top plate of the cover mechanism.

As shown by the broken lines in FIG. 8B, the top plate 61 includes a heater for heating the wafer W, e.g., an LED lamp 63. FIG. 9D is a longitudinal sectional view of the top plate 61. As shown in FIG. 9D, the LED lamp 63 is disposed inside the top plate 61. In the illustrated embodiment, there is provided one LED lamp array including the plurality of LED lamps 63. As the LED lamp 63, there is used an LED lamp configured to emit light having a wavelength suited for heating the wafer W, to be specific, e.g., light having a wavelength of 880 nm. The LED lamps 63 are covered and protected by a cover 64 formed of quartz or Teflon® that well transmits light having a wavelength of 880 nm and has an excellent corrosive resistance.

In FIGS. 8B and 9D, although there is provided the one LED lamp array of a size substantially the same as that of the wafer W, the present invention is not limited thereto. One or more LED lamp array(s) may be disposed on a position opposed to the wafer central portion, a position opposed to the wafer peripheral portion and a position opposed to a wafer intermediate portion between the wafer central portion and the wafer peripheral portion, respectively. In this case, by controlling these LED lamp arrays independently of each other, it is possible to control the temperature of the wafer W for each portion thereof (to carry out the so-called zone control). Since the outer circumferential portion of the wafer W tends to be cooled by an air flow caused by the rotation of the wafer W, an output of LED or the number of LED lamps (the number of light emitting elements) is preferably increased as a certain point approaches the outer circumferential portion. This makes it possible that the whole surface of the wafer W is uniformly heated.

In order to cool and protect the LED lamps 63 that are vulnerable to heat, a coolant path 62a may be provided inside the top plate 61 above the LED lamps 63. The coolant path 62a may be located helically or concentrically in plan view. Connected to the coolant path 62a is a coolant supply pipe (not shown) connected to a cooling-water supply source (not shown), for example.

(Shielding Mechanism)

Figure 10:
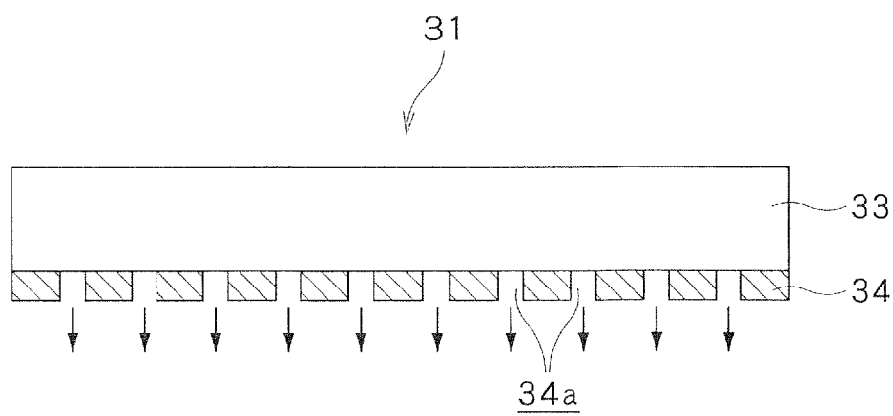
FIG. 10 is a vertical sectional view showing an air hood.

Next, the shielding mechanism 30 is described in detail. The air hood 31 of the shielding mechanism 30 is firstly described. The air hood 31 is structured to form a downflow of a clean gas, such as a clean air, in the processing space. FIG. 10 is a sectional view showing the air hood 31. The air hood 31 includes an FFU (fan filter unit) 33 and a punching plate 34 disposed below the FFU 33. The punching plate 34 has a number of holes 34a. Although not shown, inside the FFU 33, there are provided a blower for blowing an air, a filter for purifying a clean air from an air, and so on. The respective holes 34a of the punching plate 34 are uniformly distributed over all the area of the punching plate 34. Thus, the clean air generated by the FFU 33 is rectified by these holes 34a of the punching plate 34. With the use of the air hood 31 having such a structure, a rectified downflow of a clean air can be formed. Mist or the like of the process liquid can be quickly discharged by this downflow, whereby the mist can be prevented from diffusing upward. Further, an atmosphere around the wafer W in the processing space can be maintained clean. The clean gas used in the air hood 31 is not limited to a clean air, and an inert gas such as an $N_2$ gas (nitrogen gas) may be used.

(Cleaning Vessel)

As shown in FIGS. 4B and 5B, a cleaning vessel 32 may be disposed above the air hood 31. The cleaning vessel 32 can be horizontally moved together with the air hood 31, and has a containing part 32a capable of containing a liquid such as a cleaning liquid (cleaning liquid for cover mechanism, i.e., DIW). As described below, due to the provision of such a cleaning vessel 32 above the air hood 31, when the shielding mechanism 30 is situated on the advanced position, the top plate 61 of the cover mechanism 60 above the air hood 31 can be cleaned by the cleaning liquid of the cleaning vessel 32. The cleaning vessel 32 has a circular profile having a diameter larger than that of the top plate 61 of the aforementioned cover mechanism 60. Thus, by locating the cleaning vessel 32 together with the air hood 31 on the advanced position, falling down of liquid drops adhering to the top plate 61 of the cover mechanism 60 onto the wafer W can be shielded.

To the containing part 32a of the cleaning vessel 32, there may be connected an exhaust pipe (not shown) for appropriately discharging a liquid such as a cleaning liquid contained in the containing part 32a. A concrete structure of the exhaust pipe is not specifically limited. For example, the exhaust pipe may be structured such that the exhaust pipe horizontally moves or expands and contracts following to the air hood 31 and the cleaning vessel 32. Alternatively, the exhaust pipe may be fixed on a predetermined position in the chamber 20 or in the waiting room 80, such that the exhaust pipe 32 is communicated with the containing part 32a, when the air hood 31 and the cleaning vessel 32 are situated on any of the advanced position or the retracted position.

(Controller)

The liquid processing apparatus 10 includes a controller 200 that generally controls the operation of the liquid processing apparatus 10 as a whole. The controller 200 controls operations of all the functional components of the liquid processing apparatus 10 (e.g., the substrate retaining unit 21, the piston mechanism 24, the horizontal driving mechanism 35 of the shielding mechanism 30, the driving mechanism 50b of the cylindrical outer cup 50, the vertical driving mechanism 78 of the cover mechanism 60, the process-fluid supply mechanism 70, etc.) The controller 200 can be achieved by a hardware, such as a multi-purpose computer, and a software, such as a program for operating the computer (an apparatus-control program and a process recipe). The software is stored in a storage medium, such as a hard disc drive, which is fixedly mounted on the computer, or is stored in a storage medium, such as a CD ROM, a DVD, a flash memory or the like, which is detachably set in the computer. Such a storage medium is indicated by the reference number 201. Based on a command from a not-shown user interface, a processor 202 reads a predetermined process recipe from the storage medium 201 according to need, and executes the process recipe. Thus, under the control of the controller 200, the respective functional components of the liquid processing apparatus 10 are operated, to thereby perform a predetermined process. The controller 200 may be a system controller that controls the liquid processing system shown in FIG. 1 as a whole.

Next, there is described a series of steps of a cleaning process for removing the unnecessary resist film on the upper surface of the wafer W, which is performed by using the above-described liquid processing apparatus 10.

<Wafer Loading and Setting Step>

Figure 11:
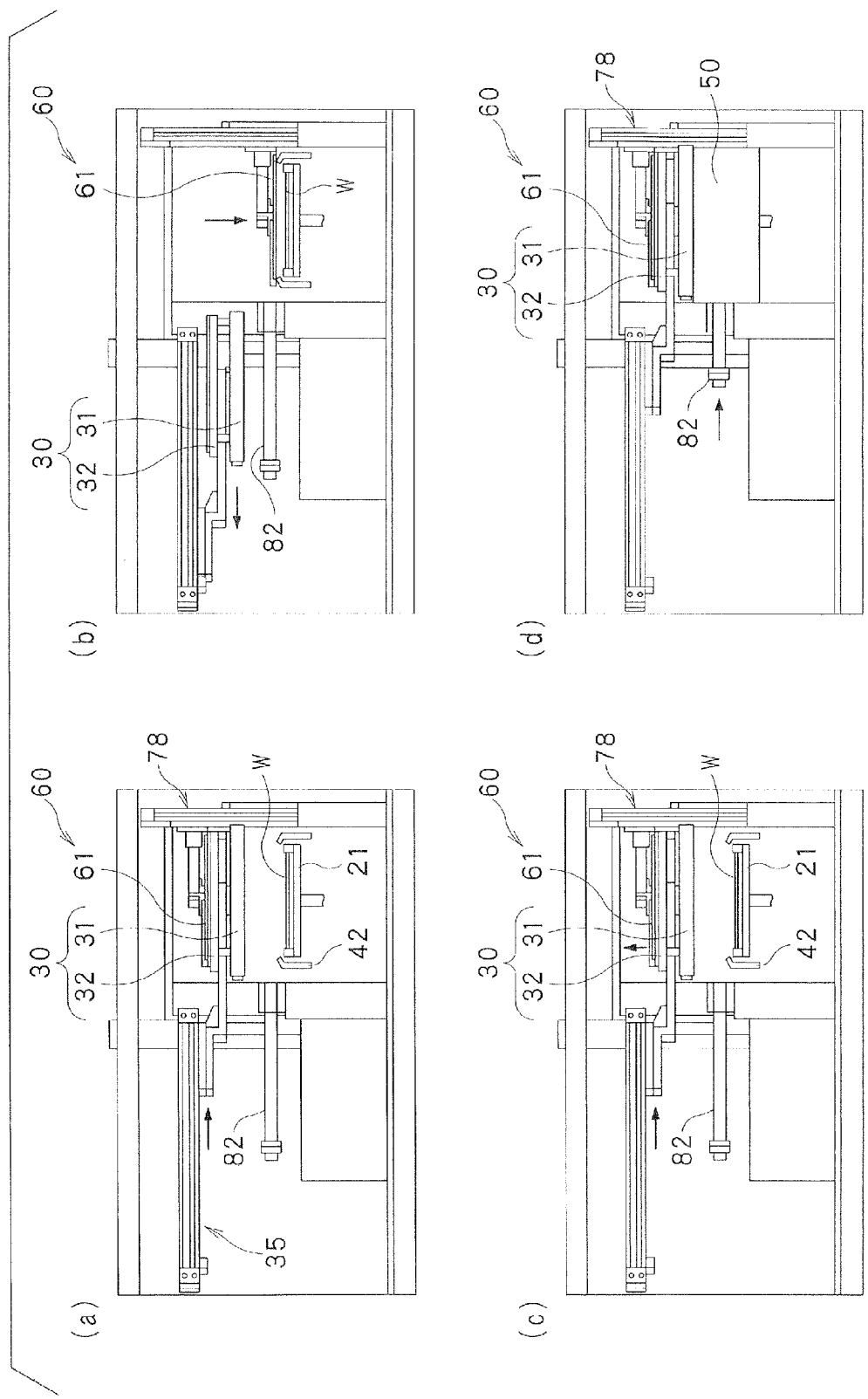
FIG. 11 is a view showing steps for subjecting a wafer to an SPM process and a cleaning process.

At first, it is confirmed that the cover mechanism 60 is situated on the raised position. Then, the shielding mechanism 30 is horizontally moved into the chamber 20 by the horizontal driving mechanism 35. Thus, as shown in FIG. 11(a), the shielding mechanism 30 is situated on the advanced position between the cover mechanism 60 and the wafer W, at which the shielding mechanism 30 shields the wafer W from the cover mechanism 60. Under this state, the air hood 31 of the shielding mechanism 30 forms a downflow of a clean gas such as a clean air.

Thereafter, the lift-pin plate 22 and the process-liquid supply pipe 28 in the substrate retaining unit 21 are moved upward from the positions shown in FIG. 6, and the shutter 94 is moved so as to open the opening 94a. Then, a wafer W is transported by the transport arm 104 from outside the liquid processing apparatus 10 into the chamber 20 through the opening 94a, and the wafer W is placed on the lift pins 23 of the lift-pin plate 22. At this time, the cylindrical outer cup 50 is situated on the cup lowered position shown in FIG. 6. The respective nozzle support arms 82 are situated on the retracted position at which the respective nozzle support arms 82 are retracted from the chamber 20. Namely, the respective nozzle support arms 82 wait in the waiting room 80. A clean gas such as a clean air is constantly sent downward from the air hood 31. The clean gas is discharged by the exhaust unit 48, so that an atmosphere in the chamber 20 is replaced.

Then, the lift-pin plate 22 and the process-liquid supply pipe 28 are moved downward, so that the lift-pin plate 22 and the process-liquid supply pipe 28 are situated on the lowered positions shown in FIG. 6. At this time, the respective retaining members 25 disposed on the retaining plate 26 support the wafer W on the lift pins 23 so as to take the wafer W slightly apart from the lift pins 23.

The wafer W is loaded into the liquid processing apparatus 10, with its "front surface" (on which a pattern is formed) facing upward ("upper surface") and its "rear surface" (on which a pattern is not formed) facing downward ("lower surface").

<SPM Cleaning Process>

Then, the downflow of a clean air from the air hood 31 of the shielding mechanism 30 is stopped. Thereafter, the shielding mechanism 30 is horizontally moved to the outside of the chamber 20. Thus, as shown in FIG. 11(b), the shielding mechanism 30 is situated on the retracted position outside the chamber 20. Then, the cover member 60 waiting on the raised position is lowered to the lowered position near to the wafer W, at which the cover mechanism 60 covers the wafer W from above. Under this state, the retaining plate 26 of the substrate retaining unit 21 is rotated. In accordance therewith, the wafer W supported by the respective retaining members 25 is rotated.

Simultaneously with the start of rotation of the wafer W or thereafter, the LED lamps 63 disposed on the top plate 61 of the cover mechanism 60 are turned on, so that the wafer W is heated from the upper surface (device formation surface) of the wafer W. At this time, the wafer W is heated to about 200° C., for example. When the temperature of the wafer W is increased to a predetermined temperature, sulfuric acid solution heated to about 200° C. is supplied from the first supply source 71 to the first supply pipe for bar nozzle 72a, and a hydrogen peroxide solution at a normal temperature is supplied from the second supply source 73 to the second supply pipe for bar nozzle 74a. As shown in FIG. 9C, the supplied sulfuric acid solution and the supplied hydrogen peroxide solution are mixed with each other immediately before each of the discharge openings 66a of the bar nozzle 66, and the thus obtained SPM liquid is discharged toward the upper surface of the wafer W. Similarly, the sulfuric acid solution heated to about 200° C. is supplied from the first supply source 71 to the first supply pipe for center nozzle 72b, and the hydrogen peroxide solution at the normal temperature is supplied from the second supply source 73 to the second supply pipe for center nozzle 74b. The supplied sulfuric acid solution and the supplied hydrogen peroxide solution are mixed with each other immediately before the center discharge opening 67a of the center nozzle 67, and the thus obtained SPM liquid is discharged toward the central portion in the upper surface of the wafer W.

When the sulfuric acid solution and the hydrogen peroxide solution are mixed with each other, the temperature of the liquid is increased by a reaction heat. The temperature of the SPM liquid discharged from the respective discharge openings 66a and the center discharge opening 67a is approximately 200 to 250° C. The resist film of the wafer W is peeled by the supplied SPM liquid. The wafer temperature decreases when the SPM liquid whose temperature is lower than the wafer temperature is supplied to the wafer W. In consideration of this point, the SPM liquid may be intermittently discharged. In this case, decrease of wafer temperature can be prevented.

The removed resist film radially flows outward, together with the SPM liquid, by the centrifugal force, on the upper surface of the wafer W, and flows downward to be received by the rotatable cup 40. Thereafter, the SPM liquid is sent to the aforementioned first process-liquid collecting tank 46a.

At this time, a fume is generated around the wafer W, but the wafer W and the upper opening of the rotatable cup 40 are covered from above with the top plate 61 of the cover mechanism 60, whereby the fume can be prevented from diffusing above the top plate 61 in the chamber 20. The fume is sucked to a drain pipe (in a slightly negative pressure condition), i.e., a negative pressure space, connected to a factory exhaust system, and thereafter the fume is separated from the SPM liquid and discharged through the exhaust unit 48.

<First DIW Rinsing Process>

After the SPM cleaning process has been performed for a predetermined period of time, the discharge of the SPM liquid from the respective discharge openings 66a an the center discharge opening 67a is stopped. In addition, the heating of the wafer W by the LED lamps 63 is stopped. After that, while the wafer W is continuously rotated, a DIW of a high temperature (hereinafter HOT-DIW) is supplied from the HOT-DIW supply source (not shown) to the cleaning-liquid supply pipe 75b at relatively a large flow rate (e.g., 1500 ml per minute). Thereafter, the cleaning-liquid discharge opening 68b near to the central portion of the top plate 61 discharges the supplied HOT-DIW toward the central portion of the wafer W. Thus, the SPM liquid and the resist residue remaining on the upper surface of the wafer W are washed away by the HOT-DIW radially flowing outward on the upper surface of the wafer W. Similarly to the SPM liquid, the used HOT-DIW is sent to the first process-liquid collecting tank 46a. At this time, since the wafer W and the upper opening of the rotatable cup 40 are continuously covered from above with the cover mechanism 60, diffusion of the fume in the chamber 20 can be prevented.

<Second DIW Rinsing Process>

Then, the cover mechanism 60 situated on the lowered position is raised to the raised position. Thereafter, the shielding mechanism 30 is horizontally moved into the chamber 20. Thus, as shown in FIG. 11(c), the shielding mechanism 30 is situated on the advanced position between the cover mechanism 60 and the wafer W, at which the shielding mechanism 30 shields the wafer W from the cover mechanism 60. During the movement of the shielding mechanism 30, the fixed nozzle 92 may discharge a process liquid such as the DIW toward the upper surface of the wafer W. In this case, even when the liquid drops and/or droplets of the SPM liquid adhering to the cover mechanism 60 fall down on the wafer during the movement of the shielding mechanism 30, the liquid drops and/or droplets can be washed away by the process liquid. Thus, adhesion of the unwanted liquid and particles to the upper surface of the wafer W can be prevented.

Then, the cylindrical outer cup 50 is raised, so that the cylindrical outer cup 50 is situated on the cup raised position as shown in FIG. 11(d). At this time, the cylindrical outer cup 50 is raised such that the cylindrical outer cup 50 and the air hood 31 are brought into contact with each other via the O-ring 50c. Thus, the space defined inside the air hood 31 and the cylindrical outer cup 50 is securely isolated from outside.

After that, among the four nozzle support arms 82 waiting in the waiting room 80, the nozzle support arm 82 supporting the nozzle 82a for supplying the DIW is moved to the nozzle advanced position in the chamber 20 through the side opening 50m of the cylindrical outer cup 50. After that, the downflow of a clean gas such as a clean air is formed by the air hood 31 in the processing space.

Following thereto, while the wafer W is continuously rotated, the nozzle 82a discharges the DIW of a low temperature (e.g., about 20° C.) toward the upper surface of the wafer W. Thus, even when the SPM liquid and/or the resist residue remains on the upper surface of the wafer W, the SPM liquid and/or the resist residue can be more reliably washed away, as well as the wafer W can be cooled.

<Spin Drying Process>

After the second DIW rinsing process has been performed for a predetermined period of time, the discharge of the DIW from the nozzle 82a is stopped. At this time, while the wafer W is being continuously rotated (preferably at an increased rotational speed), the air hood 31 forms the downflow of a clean gas such as a clean air. Thus, the DIW remaining on the upper surface of the wafer W is spun off by the centrifugal force, and the drying is promoted by the clean gas.

After the spin drying process has been finished, the rotation of the wafer W is stopped, and the nozzle 82a is horizontally moved to return to the nozzle retracted position in the waiting room 80. In addition, the cylindrical outer cup 50 is lowered to return to the cup lowered position. The air hood 31 continuously forms the downflow of a clean air.

Thereafter, the lift-pin plate 22 and the process-liquid supply pipe 28 in the substrate retaining unit 21 are moved upward from the positions shown in FIG. 6. At this time, the wafer W supported by the retaining members 25 of the retaining plate 26 is delivered to the lift pins 23 of the lift-pin plate 22. Then, the shutter 94 is moved so as to open the opening 94a. Thereafter, while the downflow of a clean air is formed by the air hood 31, the wafer W is taken out from outside the liquid processing apparatus 10 through the opening 94a, by using the transport arm 104. The wafer W having been taken out by the transport arm 104 is transported outside the liquid processing apparatus 10. In this manner, the series of the liquid processes of the wafer W are completed.

According to the above embodiment, when the resist film on the upper surface of the wafer W is removed by the SPM cleaning process of a high temperature, the upper part of the wafer W is covered with the top plate 61 of the cover mechanism 60. Thus, the fume, which has been generated above the wafer W by the evaporated SPM liquid, can be prevented from diffusing above the wafer W. Therefore, it can be prevented that the fume contaminates or corrodes the inner surface of the chamber 20 and the components in the chamber 20, which are located above the wafer W. This can inhibit a generation of a substance which may cause wafer contamination.

Further, during the second DIW rinsing process and the spin drying process succeeding to the SPM cleaning process, the air hood 31, which has been moved into the chamber 20, is located between the cover mechanism 60 and the wafer W. Above the air hood 31, there is disposed the cleaning vessel 32 having a circular profile having a diameter larger than that of the top plate 61 of the cover mechanism 60. Thus, during the second DIW rinsing process and the spin drying process, liquid drops and/or droplets of the SPM liquid possibly adhering to the top plate 61 can be prevented from falling down on the wafer W.

In addition, according to the above embodiment, due to the provision of the air hood 31, the air hood 31 can form the downflow of a clean air, while preventing liquid drops and/or droplets of a chemical liquid adhering to the cover mechanism from falling down on the wafer W. Thus, during the aforementioned second DIW rinsing process, the spin drying process or the wafer unloading step, particles floating above the wafer W can be quickly discharged, whereby the particles can be prevented from adhering to the wafer W. As a result, the wafer W can be subjected to various processes without being contaminated.

In addition, according to the above embodiment, during the SPM cleaning process, the upper opening of the rotatable cup 40 and the upper opening of the drain cup 42 are covered with the top plate 61 of the cover mechanism 60. Thus, upward leakage of the fume can be more reliably prevented.

In addition, according to the above embodiment, during the aforementioned DIW rinsing process and the spin drying process, the upper opening of the cylindrical outer cup 50 is sealed by the air hood 31. Thus, the processing space isolated from outside is defined inside the air hood 31 and the cylindrical outer cup 50. The volume of the processing space is smaller than the volume of the chamber 20. Since the second DIW rinsing process and the spin drying process are performed in such a processing space, a replacement efficiency of the atmosphere to the clean gas can be improved, to thereby enhance process efficiency. Thus, the wafer W can be subjected to various processes without being contaminated. Further, the O-ring 50c is interposed between the cylindrical outer cup 50 and the air hood 31. Therefore, the processing space defined by the air hood 31 and the cylindrical outer cup 50 can be more securely isolated from outside.

In addition, according to the above embodiment, the process-fluid nozzle 65 for discharging the SPM liquid toward the upper surface of the wafer W is disposed on the top plate 61, such that the process-fluid nozzle 65 can be vertically moved integrally with the top plate 61 of the cover mechanism 60. Further, the first supply pipe 72 and the second supply pipe 74 through which the sulfuric acid solution and the hydrogen peroxide solution are sent from the process-fluid supply mechanism 70 to the process-fluid nozzle 65 are substantially horizontally extended between the process-fluid supply mechanism 70 and the process-fluid nozzle 65. Namely, the direction in which the process-fluid nozzle 65 is moved, and the direction in which the first supply pipe 72 and the second supply pipe 74 connected to the process-fluid nozzle 65 are mainly extended, are perpendicular to each other. Thus, when the process-fluid nozzle 65 is vertically moved together with the top plate 61, bending stresses generated in the first supply pipe 72 and the second supply pipe 74 can be reduced. Accordingly, even when the first supply pipe 72 is formed of a material such as PFA having a predetermined heat resistance, the first supply pipe 72 can be prevented from being damaged, which might be caused by the vertical movement of the process-fluid nozzle 65. As a result, the reliability of the first supply pipe 72 can be improved, whereby the sulfuric acid solution heated to a high temperature can be stably supplied to the process-fluid nozzle 65 through the first supply pipe 72.

In addition, according to the above embodiment, in the SPM cleaning process, there is used the bar nozzle 66 having the plurality of discharge openings 66a that are arranged between the position opposed to the central portion of the wafer W and the position opposed to the peripheral portion of the wafer W, and are configured to respectively discharge the same process fluid. Thus, the SPM cleaning process can be performed to the upper surface of the wafer W with high in-plane uniformity.

In addition, according to the above embodiment, in the SPM cleaning process, in addition to the bar nozzle 66, there is used the center nozzle 67 having the discharge opening 67a arranged on the position opposed to the central portion of the wafer W. The flow rates of the sulfuric acid solution and the hydrogen peroxide solution to be supplied to the center nozzle 67 are controlled independently of the flow rates of the sulfuric acid solution and the hydrogen peroxide solution to be supplied to the bar nozzle 66. Thus, the flow rates of the SPM liquid to be discharged from the bar nozzle 66 and the center nozzle 67 can be adjusted independently of each other. For example, depending on a rotational speed of the wafer W and a temperature of the wafer W or the SPM liquid, a ratio of the flow rates of the SPM liquid to be discharged from the bar nozzle 66 and the center nozzle 67 can be appropriately determined. Therefore, regardless of the rotational speed of the wafer W and the temperature of the wafer W or the SPM liquid, the SPM cleaning process can be performed to the upper surface of the wafer W with high in-plane uniformity.

In addition, according to the above embodiment, since the wafer W is heated by the heater disposed on the top plate of the cover mechanism 60, the SPM process can be promoted. Further, since the top plate 61 has both the function of shielding the fume and the function of heating the wafer W, the number of components can be reduced. Further, the LED lamps 63 that emit light of a wavelength suited for heating the wafer W are used as the heater, the temperature of the wafer W can be quickly increased.

In addition, according to the above embodiment, each of the discharge openings 66a of the bar nozzle 66 is structured such that, immediately before the discharging operation, the sulfuric acid solution and the hydrogen peroxide solution are mixed with each other so as to generate the SPM liquid. Thus, immediately before the discharging operation, generation of heat caused by mixing the sulfuric acid solution and the hydrogen peroxide solution starts. Therefore, immediately before the discharge opening 66a, the sulfuric acid solution and the hydrogen peroxide solution can be made to flow at lower temperatures (as compared with a case in which the sulfuric acid solution and the hydrogen peroxide solution are mixed with each other in advance), whereby the loads on the supply pipes for the sulfuric acid solution and the hydrogen peroxide solution can be reduced.

In addition, according to the above embodiment, after the SPM cleaning process, there is firstly performed the first DIW rinsing process by the HOT-DIW discharged from the process-fluid nozzle 65 disposed on the top plate 61. Then, there is performed the second DIW rinsing process by the DIW of a low temperature in the space isolated by the air hood 31 and the cylindrical outer cup 50. Effects obtained by these stepwise DIW rinsing processes are described below.

In the first instance, there can be obtained an effect of more reliably preventing contamination in the chamber 20.

As described above, in the SPM cleaning process, the SPM liquid of a high temperature is discharged onto the upper surface of a wafer W, and the wafer W is heated by the heater disposed on the top plate 61. Thus, the temperature of the wafer W, which has been just subjected to the SPM cleaning process, is high, e.g., 100 degrees Celsius or more. In this case, when the top plate 61 of the cover mechanism 60 is raised immediately after the SPM cleaning process has been finished, the vapor of components included in the SPM liquid, such as sulfuric acid solution, may diffuse inside the chamber 20, resulting in contamination of the chamber 20.

On the other hand, according to the above embodiment, after the SPM cleaning process has been finished, the first DIW rinsing process is performed by the HOT-DIW discharged from the process-fluid nozzle 65 disposed on the top plate 61, while the wafer W is kept covered by the top plate 61 from above. Thus, while the vapor of components included in the SPM liquid, such as sulfuric acid solution, is prevented from diffusing inside the chamber 20, the upper surface of the wafer W can be cleaned and the temperature of the wafer W can be lowered.

In the second instance, there can be obtained an effect of further improving the cleaning efficiency of the wafer W.

Generally, the higher the temperature of DIW is, the higher the effect of removing the SPM liquid remaining on the wafer W is. Thus, according to the above embodiment, since the first DIW rinsing process is performed by using the HOT-DIW, the SPM liquid remaining on the wafer W can be efficiently removed.

In the third instance, there can be obtained an effect of restraining warp of the wafer W.

As described above, immediately after the SPM cleaning process has been finished, the temperature of the wafer W is high. In this case, when a difference between the temperature of the wafer W and the temperature of the DIW is large, there is a possibility that the wafer warps because of the temperature difference between the wafer W and the DIW.

On the other hand, according to the above embodiment, after the SPM cleaning process has been finished, there is firstly performed the first DIW rinsing process in which the HOT-DIW of a high temperature is discharged to the wafer W. Then, there is performed the second DIW rinsing process in which the DIW, whose temperature is lower than the DIW used in the first DIW rising process, is discharged to the wafer W. Since the wafer W is cooled in a stepwise manner, the difference between the temperature of the wafer W and the temperature of the DIW can be made smaller, whereby it can be restrained that the wafer W warps in the DIW rinsing process.

<Top-Plate Cleaning Process>

As described above, during the SPM cleaning process, there is a possibility that liquid drops of the SPM liquid adhere to the lower surface of the top plate 61 of the cover mechanism 60. In this case, there may be further performed a process for cleaning the top plate 61 to which the liquid drops of the SPM liquid adhere. The process for cleaning the top plate 61 is described below.

Figure 12:
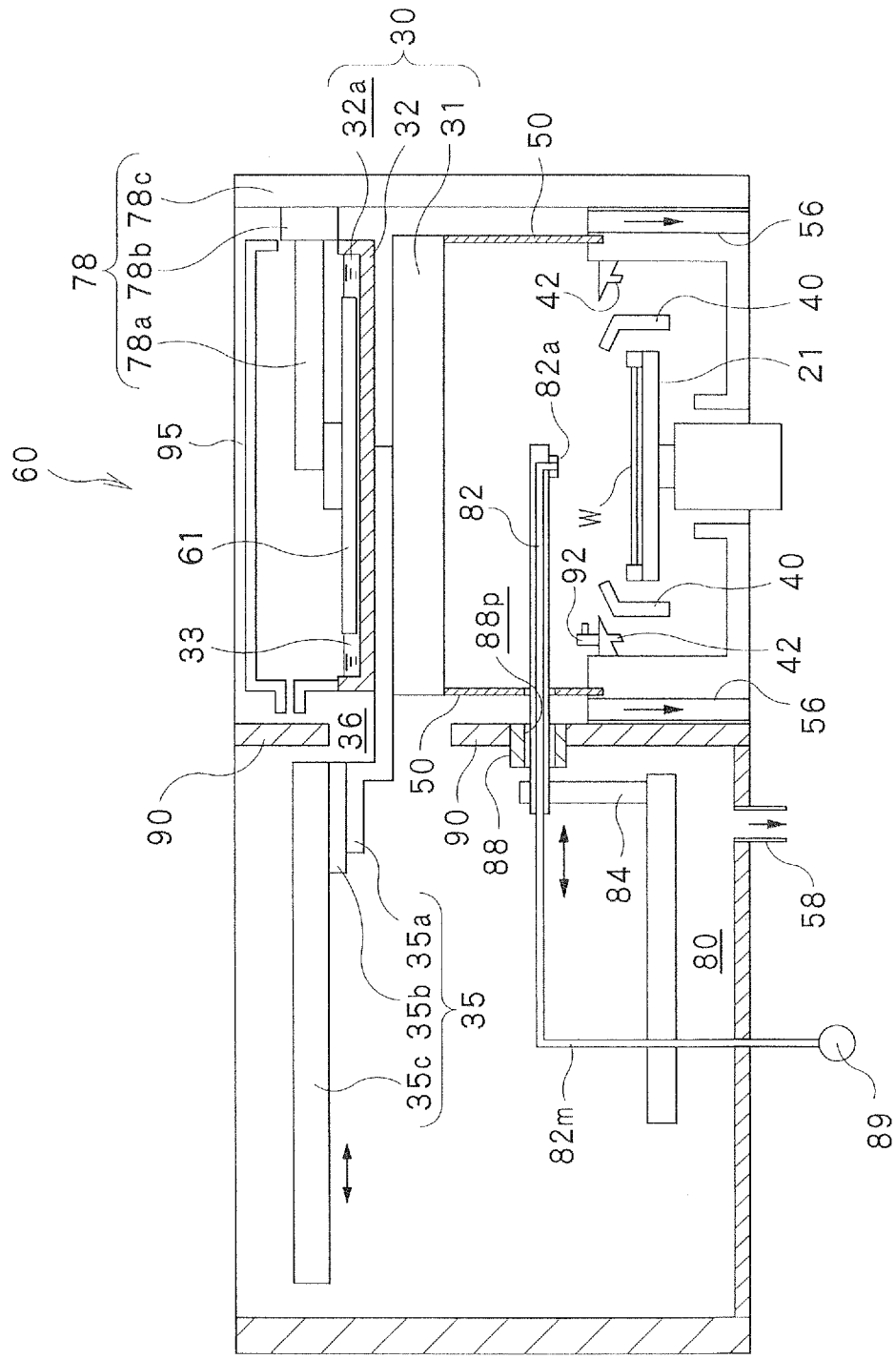
FIG. 12 is a view showing that the top plate of the cover mechanism is cleaned.

FIG. 12 is a view showing an embodiment for cleaning the top plate 61 of the cover mechanism 60. FIG. 12 shows an example in which DIW is stored in the containing part 32a of the cleaning vessel 32 disposed above the air hood 31, and the top plate 61 of the cover mechanism 60 is cleaned by the DIW. At this time, the cover mechanism 60 is lowered from the aforementioned raised position (FIG. 5B) so as to be situated on a lowered position (cleaning position).

After the top plate 61 has been fully cleaned by using the DIW in the containing part 32a, the top plate 61 is returned to the raised position. Thereafter, the top plate 61 is heated by the heat of the heater itself disposed on the top plate 61. Thus, the DIW adhering to the top plate 61 evaporates. In this manner, the top plate 61 to which the liquid drops of the SPM liquid adhere is cleaned. Thereafter, the DIW in the containing part 32a is discharged through a drain pipe (not shown). As shown in FIG. 12, in order to prevent diffusion inside the chamber 20 of the vapor of the SPM liquid and the DIW, which may possibly generate during the cleaning of the top plate 61, an exhaust mechanism 95 configured to discharge the vapor of the SPM liquid and the DIW to the outside may be disposed above the top plate 61. Due to the provision of such an exhaust mechanism 95, not only that the chamber 20 can be prevented from being contaminated, but also that the temperature of the environment of the top plate 61 can be maintained during the top-plate cleaning process, whereby the cleaning efficiency of the top plate 61 can be improved. In addition, it can be prevented that the heat leaks to the atmosphere around the top plate 61 so that other components around the top plate 61 are heated.

A method of supplying the DIW for cleaning the top plate 61 into the containing part 32a of the cleaning vessel 32 is not specifically limited. For example, DIW may be supplied to the containing part 32a through the cleaning-liquid discharge opening 68b of the process-fluid nozzle 65 disposed on the top plate 61. Alternatively, when the shielding mechanism 30 is retracted in the waiting room 80, DIW may be supplied to the containing part 32a from a DIW supply mechanism (not shown) which is disposed separately from the cleaning-liquid discharge opening 68b.

A timing at which the top-plate cleaning process is performed is not specifically limited. For example, the top-plate cleaning process may be performed between the first DIW rinsing process and the second DIW rinsing process, or may be performed simultaneously with the second DIW rising process. Alternatively, the top-plate cleaning process may be performed between the second DIW rinsing process and the spin drying process, or may be performed simultaneously with the spin drying process. Alternatively, the top-plate cleaning process may be performed after the wafer unloading step.

<Alternative Embodiment of Top-Plate Cleaning Process>

Figure 13:
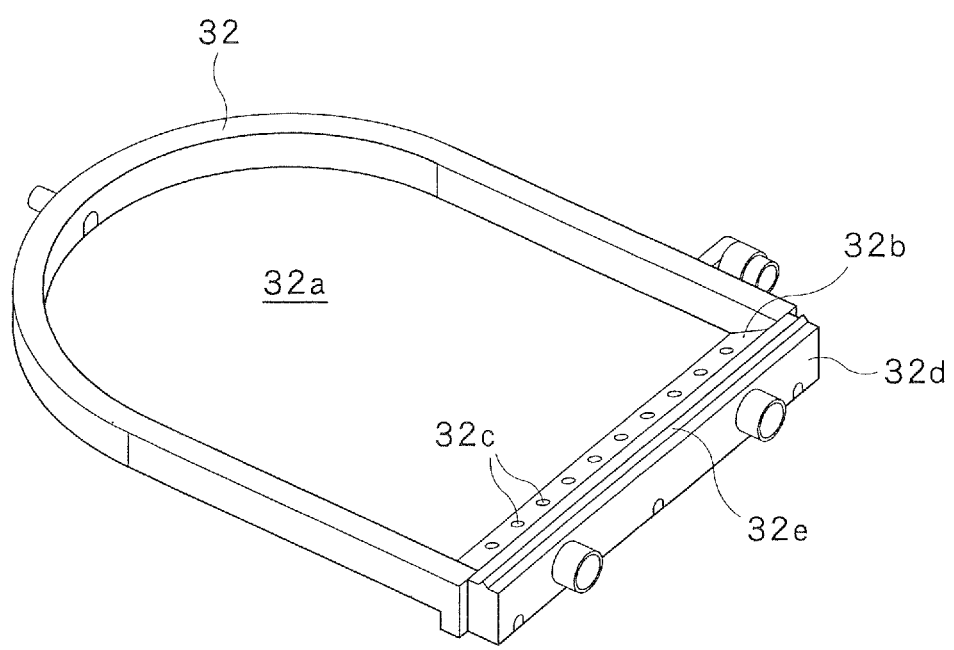
FIG. 13 is a view showing an alternative embodiment of a cleaning vessel of the shielding mechanism.

FIG. 12 shows the example in which the top plate 61 is cleaned by the DIW stored in the containing part 32a. However, not limited thereto, the top plate 61 may be cleaned by another method. For example, as shown in FIG. 13, a cleaning nozzle 32b having a discharge opening 32c may be provided on the cleaning vessel 32. A cleaning liquid such as DIW is discharged from the discharge opening 32c toward the lower surface of the top plate 61. In addition, as shown in FIG. 13, drying means for drying the cleaning liquid adhering to the lower surface of the top plate 61 may be further provided on the cleaning vessel 32. As shown in FIG. 13, for example, the drying means 32d may have a slit 32e for blowing an air toward the lower surface of the top plate 61. A cleaning method of the top plate 61 in a case where the cleaning vessel 32 is provided with the cleaning nozzle 32b and the drying means 32d is described herebelow with reference to FIGS. 14(a) to 14(d).

Figure 14:
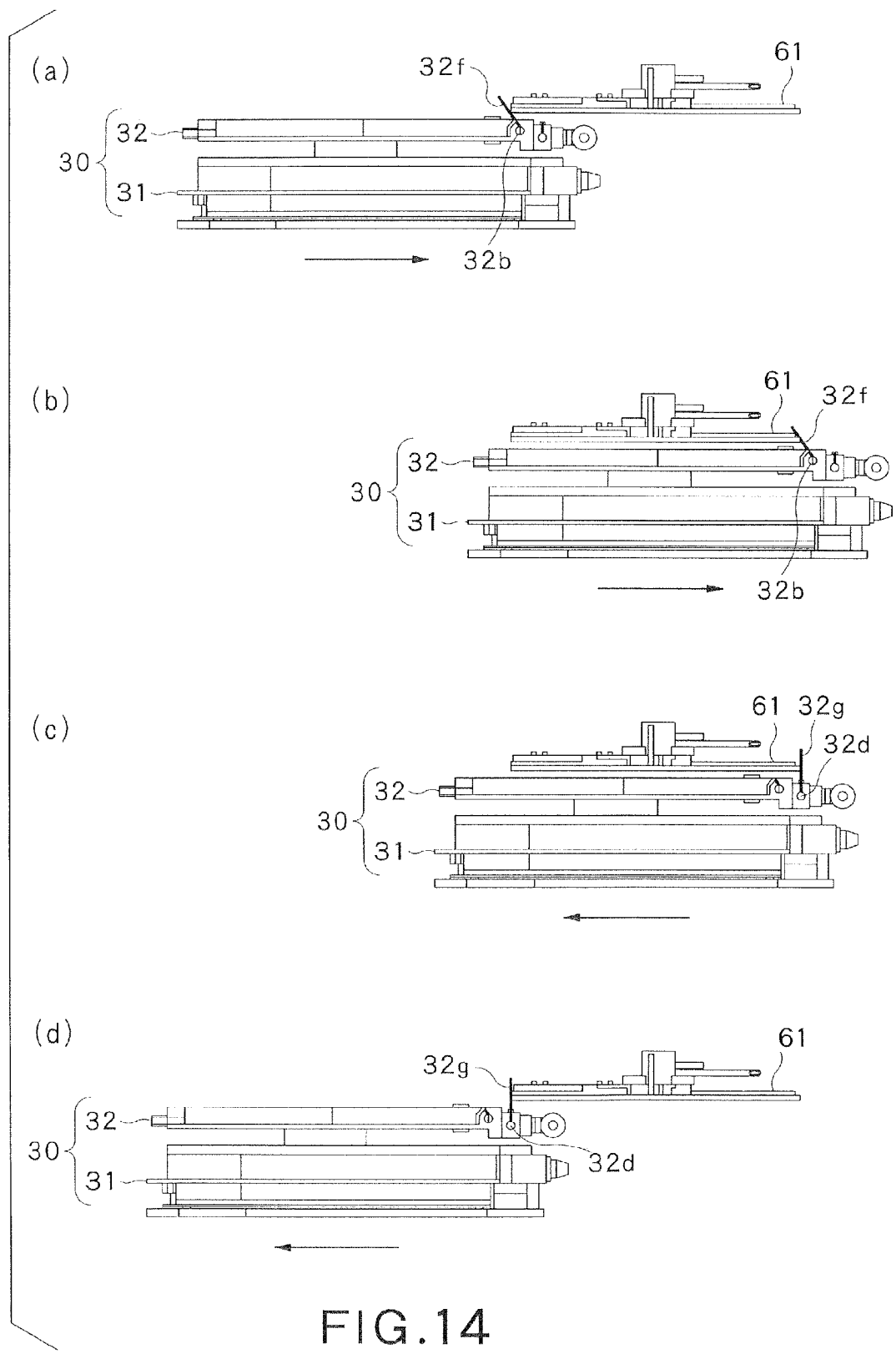
FIG. 14 is a view showing that the top plate of the cover mechanism is cleaned.

As shown in FIG. 14(a), by using the cleaning nozzle 32b of the cleaning vessel 32, a cleaning liquid 32f is firstly discharged toward a part neighboring to an end portion of the top plate 61 on the side of the cleaning vessel 32, i.e., the part neighboring to the end portion on the side of the waiting room 80. The discharged cleaning liquid 32f is contained in the containing part 32a. Then, while the cleaning liquid 32f is discharged toward the top plate 61 by means of the cleaning nozzle 32b, the shielding mechanism 30 including the cleaning vessel 32 is moved toward the top plate 61, i.e., toward the aforementioned advanced position (see the arrow in FIG. 14(a)). For example, as shown in FIG. 14(b), the shielding mechanism 30 including the cleaning vessel 32 is moved toward the advanced position, until the cleaning liquid 32f discharged from the cleaning nozzle 32b reaches a part neighboring to an end portion opposed to the end portion of the top plate 61 on the side of the waiting room 80. Thus, the lower surface of the top plate 61 is cleaned as a whole by the cleaning liquid 32f. Therefore, the lower surface of the top plate 61 can be cleaned without scattering the cleaning liquid in the chamber 20.

Thereafter, the discharge of the cleaning liquid 32f from the cleaning nozzle 32b is stopped. Then, as shown in FIG. 14(c), by using the drying means 32d of the cleaning vessel 32, an air 32g is blown to the part neighboring to the end portion opposed to the end portion of the top plate 61 on the side of the waiting room 80. Then, while the air 32g is discharged toward the top plate 61 by means of the drying means 32d, the shielding mechanism 30 including the cleaning vessel 32 is moved toward the waiting room 80 i.e., toward the aforementioned retracted position (see the arrow in FIG. 14(c)). For example, as shown in FIG. 14(d), the shielding mechanism including the cleaning vessel 32 is moved toward the retracted position, until the air 32g from the drying means 32d reaches the part neighboring to the end portion of the top plate 61 on the side of the waiting room 80. Thus, the cleaning liquid adhering to the lower surface of the top plate 61 can be removed as a whole by the air 32g. In this manner, the top plate 61, which has been cleaned by the cleaning liquid 32f, can be dried.

As described above, in this embodiment, the containing part 32a of the cleaning vessel 32 may be a member that cleans the top plate 61 by the cleaning liquid stored in the containing part 32a, which is shown in FIG. 12, or may be a member that collects and receives the cleaning liquid that has been discharged toward the lower surface of the top plate 61, which is shown in FIG. 13 and FIGS. 14(a) to 14(d).

FIG. 13 and FIGS. 14(a) to 14(d) show the example in which the drying means 32d is realized by the slit 32e that blows an air toward the lower surface of the top plate 61. However, concrete mans for drying the plate 61 is not limited to an air. For example, the drying means 32d may be structured such that the drying means 32d brings a resilient member such as a rubber member into contact with the lower surface of the top plate 61, and moves the resilient member along the lower surface of the top plate 61, so as to physically remove the cleaning liquid 32f adhering to the lower surface of the top plate 61.

<Other Processes>

The above embodiment can be modified as described below, for example.

In the above embodiment, the resist film is removed by sequentially performing the chemical cleaning process by the SPM liquid, the first DIW rinsing process, the second DIW rinsing process and the spin drying process. However, a process carried out by the liquid processing apparatus according to this embodiment is not limited thereto. For example, the chemical cleaning process may be a wet etching process using mixed acid (mixture of sulfuric acid solution and nitric acid solution). Also in this case, the succeeding rinsing process and the spin drying process using $N_2$ can be similarly performed.

<DHF Cleaning Process>

In addition, before the SPM cleaning process, there may be performed a DHF cleaning process in which a wafer W is cleaned by using a further cleaning liquid, e.g., diluted hydrofluoric acid solution (DHF (diluted HF) liquid) obtained by diluting hydrofluoric acid with deionized water. In this case, similarly to the second DIW rinsing process and the spin drying process, the DHF cleaning process is performed under a state in which the cover mechanism 60 is situated on the raised position, the shielding mechanism 30 is situated on the advanced position, and the cylindrical outer cup 50 is situated on the cup raised position. Namely, the DHF cleaning process is performed while the space around the wafer W is securely isolated by the air hood 31 and the cylindrical outer cup 50. In addition, the DHF liquid is discharged toward the wafer W from the nozzle 82a for supplying the DHF liquid among the four nozzle support arms 82 waiting in the waiting room 80. The used DHF liquid is stored in the tank 46b for DHF liquid among the process-liquid collecting tanks 46a to 46d and discharged.

<SC-1 Process>

In addition, between the second DIW rinsing process and the spin drying process, there may be performed an SC-1 process in which a wafer W is cleaned by using a further cleaning liquid, e.g., a mixture solution of ammonia, hydrogen peroxide and water (so-called SC (Standard Clean)-1 liquid). In this case, similarly to the second DIW rinsing process and the spin drying process, the SC-1 process is performed under a state in which the cover mechanism 60 is situated on the raised position, the shielding mechanism 30 is situated on the advanced position, and the cylindrical outer cup 50 is situated on the cup raised position. Namely, the SC-1 process is performed while the space around the wafer W is securely isolated by the air hood 31 and the cylindrical outer cup 50. The SC-1 liquid is discharged toward the wafer W from the nozzle 82a for supplying SC-1 liquid among the four nozzle support arms 82 waiting in the waiting room 80. The used SC-1 liquid is stored in the tank 46c for SC-1 liquid among the process-liquid collecting tanks 46a to 46d.

<Physical Cleaning Process>

In addition, between the SC-1 cleaning process and the spin drying process, there may be performed a physical cleaning process in which a wafer W is cleaned by applying a physical force onto the upper surface of the wafer W. For example, there may be performed an AS cleaning process in which a two-fluid spray (liquid drops) including a mixed flow of a DIW mist and an $N_2$ gas is discharged by means of a two-fluid nozzle (not shown) toward the upper surface of the wafer W. Owing to the AS cleaning process, substances such as resist residues and particles remaining on the upper surface of the wafer can be removed by collision energy of the two-fluid spray.

Similarly to the second DIW rinsing process and the spin drying process, the physical cleaning process is performed under a state in which the cover mechanism 60 is situated on the raised position, the shielding mechanism 30 is situated on the advanced position, and the cylindrical outer cup 50 is situated on the cup raised position. Namely, the physical cleaning process is performed while the space around the wafer W is securely isolated by the air hood 31 and the cylindrical outer cup 50. The two-fluid nozzle is disposed on one of the four nozzle support arms 82 waiting in the waiting room 80, and the DIW and the $N_2$ gas are supplied to the two-fluid nozzle.

Another Embodiment

In the above embodiment, there is shown the example in which the LED lamps 63 are used as the heater disposed on the top plate 61 for heating the wafer W. However, not limited thereto, it is possible to use a heating lamp other than the LED lamp, such as a halogen lamp. However, from the viewpoint of selectively heating the wafer W and the viewpoint of space efficiency, the LED lamp is preferably used.

In addition, in the above embodiment, there is shown the example in which the process-fluid nozzle 65 for supplying a chemical liquid onto the upper surface of the wafer W includes the bar nozzle 66 and the center nozzle 67. However, not limited thereto, only the bar nozzle 66 may be used or only the center nozzle 67 may be used.

In addition, in the above embodiment, there is shown the example in which the substrate retaining unit of the so-called "spin-chuck" type, which is a mechanism for retaining and rotating the wafer W, includes the lift-pin plate 22 and the retaining plate 26 integral with the rotatable cup 40. However, the liquid processing apparatus 10 may include various types of spin chuck.

In addition, in the above embodiment, there is shown the example in which the process-fluid nozzle 65 is incorporated in the top plate 61. However, not limited thereto, the process-fluid nozzle 65 may be located on a position apart from the top plate 61. In this case, in order that the process-fluid nozzle 65 and the top plate 61 are vertically driven together by the vertical driving mechanism 78, a certain connection member (not shown) may be interposed between the process-fluid nozzle 65 and the top plate 61. Alternatively, in order that the process-fluid nozzle 65 can be vertically moved independently of the top plate 61, a vertical driving mechanism for process-fluid nozzle 65 (not shown) may be disposed.

In addition, in the above embodiment, there is shown the example in which, when the cover member 60 is situated on the raised position, falling down of the liquid drops of the SPM liquid adhering to the top plate 61 onto the wafer W is shielded by locating the shielding mechanism 30 having the air hood 31 and the cleaning vessel 32 on the advanced position between the cover mechanism 60 and the wafer W. However, it is not necessary for the shielding mechanism 30 to have both the air hood 31 and the cleaning vessel 32, and the shielding mechanism 30 of various types may be used.

For example, falling down of the liquid drops of the SPM liquid adhering to the top plate 61 onto the wafer W may be shielded by the shielding mechanism 30 which does not the cleaning vessel 32 but has the air hood 31. In this case, the shape of the air hood 31 is designed so as to have a profile embracing at least the top plate 61 of the cover mechanism 60 in plan view. Thus, when the air hood 31 is situated on the advanced position between the cover mechanism 60 and the wafer W, the wafer W can be shielded from the cover mechanism 60. Namely, the air hood 31 can serve as the shielding mechanism 30.

The invention claimed is:

1. A liquid processing apparatus comprising:
   a substrate retaining unit configured to horizontally retain a substrate;
   a process-fluid nozzle disposed above the substrate retained by the substrate retaining unit;
   a process-fluid supply mechanism configured to supply a chemical liquid to the process-fluid nozzle;
   a cover mechanism capable of covering the substrate from above;
   a vertical driving mechanism configured to vertically drive the cover mechanism between a lowered position at which the cover mechanism covers the substrate from above, and a raised position that is higher than the lowered position;
   an air hood configured to form a downflow of a clean gas; and
   a horizontal driving mechanism configured to horizontally drive the air hood between an advanced position at which the air hood completely shields the substrate from the cover mechanism, and a retracted position at which the air hood does not shield the substrate from the cover mechanism,
   wherein the cover mechanism is situated on the lowered position when the chemical liquid is discharged to the substrate by the process-fluid nozzle,
   wherein the lowered position is a position that is lower than the advanced position of the air hood, and the raised position is a position that is higher than the advanced position of the air hood.

2. The liquid processing apparatus according to claim 1, wherein:
   the air hood is situated between the substrate and the cover mechanism when the cover mechanism is situated on the raised position.

3. The liquid processing apparatus according to claim 1, wherein:
   the air hood vertically shields the substrate from the cover mechanism when the air hood is situated on the advanced position.

4. The liquid processing apparatus according to claim 1, further comprising:
   a rotatable cup disposed around the substrate; and
   a cylindrical outer cup disposed around the rotatable cup and having an upper opening in an upper part, the cylindrical outer cup being configured to be vertically movable between a cup raised position and a cup lowered position;
   wherein, when the cylindrical outer cup is situated on the cup raised position, the upper opening of the cylindrical outer cup is close to or in contact with the air hood situated on the advanced position, and define a processing space inside the air hood and the cylindrical outer cup.

5. The liquid processing apparatus according to claim 4 further comprising:
   a movable nozzle configured to discharge a cleaning liquid to the substrate, when the air hood is situated on the advanced position; and
   a nozzle support arm configured to support the movable nozzle, the nozzle support arm being configured to be movable between a nozzle advanced position at which the movable nozzle is located above the substrate, and a nozzle retracted position at which the movable nozzle is retracted to the outside of the substrate;
   wherein the cylindrical outer cup is provided with a side opening through which the nozzle support arm can pass.

6. The liquid processing apparatus according to claim 1, wherein
   a cleaning vessel containing a cleaning liquid for the cover mechanism is disposed on the air hood, the cleaning vessel being configured to be opposed to the cover mechanism when the air hood is situated on the advanced position.

7. The liquid processing apparatus according to claim 1, wherein
   the process-fluid nozzle is disposed on the cover mechanism.

8. The liquid processing apparatus according to claim 1, wherein:
   the chemical liquid is a mixed chemical liquid obtained by mixing a first chemical liquid and a second chemical liquid;
   the process-fluid supply mechanism includes a first supply source accommodating the first chemical liquid, a first supply pipe through which the first chemical liquid is supplied from the first supply source to the process-fluid nozzle, a second supply source accommodating the second chemical liquid, and a second supply pipe through which the second chemical liquid is supplied from the second supply source to the process-fluid nozzle;
   at least the first chemical liquid of the first and second chemical liquids is supplied from the first supply source to the process-fluid nozzle through the first supply pipe, while the first chemical liquid is being heated; and
   the first supply pipe is horizontally extended between the first supply source and the process-fluid nozzle.

9. The liquid processing apparatus according to claim 8, wherein
the first chemical liquid is sulfuric acid solution and the second chemical liquid is hydrogen peroxide solution.

10. The liquid processing apparatus according to claim 1, further comprising a heater disposed on the cover mechanism, the heater being configured to heat the substrate when the cover mechanism is situated on the lowered position.

11. The liquid processing apparatus according to claim 1, wherein
the process-fluid nozzle includes a perforated nozzle having a plurality of discharge openings that are arranged between a position opposed to a central portion of the substrate and a position opposed to a peripheral portion of the substrate thereof.

12. The liquid processing apparatus according to claim 1, further comprising:
a nozzle configured to discharge a fluid to the substrate from a position that is below the air hood when the air hood is situated on the advanced position.

13. The liquid processing apparatus according to claim 1, wherein
the air hood has a number of holes through which the downflow of the clean gas passes.

14. A liquid processing method comprising:
retaining a substrate in a horizontal posture by a substrate retaining unit;
covering the substrate from above by a cover mechanism which is situated on a lowered position;
supplying a chemical liquid to the substrate by a process-fluid nozzle disposed above the substrate;
moving, by a vertical driving mechanism, the cover mechanism to a raised position that is higher than the lowered position;
locating an air hood between the cover mechanism, which has been moved upward, and the substrate;
forming a downflow of a clean gas by the air hood; and
horizontally driving the air hood, by a horizontal driving mechanism, between an advanced position at which the air hood completely shields the substrate from the cover mechanism, and a retracted position at which the air hood does not shield the substrate from the cover mechanism,
wherein the cover mechanism is situated on the lowered position when the chemical liquid is discharged to the substrate by the process-fluid nozzle,
wherein the lowered position is a position that is lower than the advanced position of the air hood, and the raised position is a position that is higher than the advanced position of the air hood.

15. The liquid processing method according to claim 14, further comprising cleaning the cover mechanism by using a cleaning liquid for the cover mechanism,
wherein the cleaning liquid for the cover mechanism is contained in a cleaning vessel disposed on the air hood.

16. The liquid processing method according to claim 14, wherein
the process-fluid nozzle is disposed on the cover mechanism to the substrate.

17. The liquid processing method according to claim 14 further comprising drying the substrate after the supplying of the chemical liquid to the substrate,
wherein:
a cylindrical outer cup configured to be vertically movable between a cup raised position and a cup lowered position, and having an upper opening formed in an upper part thereof is arranged around the substrate; and
when the substrate is dried, the cover mechanism is situated on the raised position, the air hood is situated between the substrate and the cover mechanism, and the cylindrical outer cup is situated on the cup raised position.

18. The liquid processing method according to claim 17, wherein:
the process-fluid nozzle, which supplies the chemical liquid, is disposed on the cover mechanism,
the air hood is horizontally movable between an advanced position at which the air hood is situated between the substrate and the cover mechanism, and a retracted position; and
when the chemical liquid is supplied to the substrate, the air hood is situated on the retracted position, the cover mechanism is situated on the lowered position, the cylindrical outer cup is situated on the cup lowered position, and the chemical liquid is supplied to the substrate from the process-fluid nozzle.

19. The liquid processing method according to claim 18 further comprising discharging a cleaning liquid from a movable nozzle to the substrate, after the supplying of the chemical liquid to the substrate and before the drying of the substrate,
wherein:
when the cylindrical outer cup is situated on the cup raised position and the air hood is situated on the advanced position, the cylindrical outer cup is close to or in contact with the air hood, to thereby define a processing space inside the air hood and the cylindrical outer cup;
the movable nozzle is supported by a nozzle support arm that is movable between a nozzle advanced position at which the movable nozzle is located above the substrate, and a nozzle retracted position at which the movable nozzle is retracted to the outside of the substrate;
the cylindrical outer cup is provided with a side opening through which the nozzle support arm passes when the nozzle support arm is moved between the nozzle advanced position and the nozzle retracted position; and
when the cleaning liquid is discharged from the movable nozzle to the substrate, the air hood is situated on the advanced position, the cover mechanism is situated on the raised position, the cylindrical outer cup is situated on the cup raised position, and the nozzle support arm is situated on the nozzle advanced position.

20. A non-transitory computer-readable storage medium storing a computer executable program that, when executed, causes a computer to execute the liquid processing method according to claim 14.

* * * * *